(12) United States Patent
Kim et al.

(10) Patent No.: US 10,043,879 B1
(45) Date of Patent: Aug. 7, 2018

(54) SEMICONDUCTOR DEVICES UTILIZING CAPPING LAYERS WITH MULTIPLE WIDTHS AND METHODS OF MANUFACTURING THE SAME

(71) Applicant: Samsung Electronics Co., Ltd., Suwon-si, Gyeonggi-do (KR)

(72) Inventors: Yoon-jae Kim, Hwaseong-si (KR); Ho-young Kim, Seongnam-si (KR); Dong-kwon Kim, Suwon-si (KR); Jin-hyuk Yoo, Hwaseong-si (KR); Woo-jin Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/660,432

(22) Filed: Jul. 26, 2017

(30) Foreign Application Priority Data

Mar. 9, 2017 (KR) .......................... 10-2017-0030277

(51) Int. Cl.
| | | |
|---|---|---|
| *H01L 21/70* | (2006.01) | |
| *H01L 29/423* | (2006.01) | |
| *H01L 29/78* | (2006.01) | |
| *H01L 29/51* | (2006.01) | |
| *H01L 29/66* | (2006.01) | |

(52) U.S. Cl.
CPC ...... *H01L 29/42368* (2013.01); *H01L 29/518* (2013.01); *H01L 29/66553* (2013.01); *H01L 29/66795* (2013.01); *H01L 29/785* (2013.01)

(58) Field of Classification Search
CPC ............. H01L 29/42368; H01L 29/518; H01L 29/66553; H01L 29/66795; H01L 29/785; H01L 27/0886; H01L 27/0924; H01L 29/41791; H01L 29/66772; H01L 21/02362; H01L 21/76829
USPC ......... 257/288, 368, 369; 438/151, 197, 199
See application file for complete search history.

(56) References Cited

U.S. PATENT DOCUMENTS

| | | | |
|---|---|---|---|
| 7,776,680 B2 | 8/2010 | Basker et al. | |
| 8,153,498 B2 | 4/2012 | Hsu et al. | |
| 8,765,537 B2 | 7/2014 | Ng et al. | |
| 8,835,244 B2 | 9/2014 | Xie et al. | |
| 8,946,793 B2 | 2/2015 | Xie et al. | |
| 9,490,341 B2 | 11/2016 | Liou et al. | |
| 9,812,363 B1 * | 11/2017 | Liao ................ | H01L 21/823418 |
| 2014/0197468 A1 * | 7/2014 | Xie ......................... | H01L 29/78 257/288 |
| 2016/0056162 A1 | 2/2016 | Yeh et al. | |

* cited by examiner

*Primary Examiner* — Shahed Ahmed
(74) *Attorney, Agent, or Firm* — Myers Bigel, P.A.

(57) ABSTRACT

A semiconductor device includes a fin active region protruding from a substrate and extending in a first direction, a gate electrode covering an upper surface and sidewalls of the fin active region and extending in a second direction crossing the first direction, a gate spacer structure on opposite sidewalls of the gate electrode, an insulating capping layer on the gate electrode and extending in the second direction, an insulating liner on opposite sidewalls of the gate electrode and on an upper surface of the gate spacer structure, and a self-aligned contact at a side of the gate electrode. The insulating liner may have a second thickness greater than a first thickness of the gate spacer structure. A sidewall of the self-aligned contact may be in contact with the gate spacer structure and the insulating liner.

20 Claims, 21 Drawing Sheets

SEMICONDUCTOR DEVICES UTILIZING CAPPING LAYERS WITH MULTIPLE WIDTHS AND METHODS OF MANUFACTURING THE SAME

CROSS-REFERENCE TO RELATED APPLICATION

This application claims priority under 35 U.S.C. § 119 to Korean Patent Application No. 10-2017-0030277 filed on Mar. 9, 2017, in the Korean Intellectual Property Office, the entire contents of which are hereby incorporated by reference.

BACKGROUND

Technical Field

Example embodiments of the present inventive concepts relate to semiconductor devices and methods of manufacturing the same, and more specifically, to semiconductor devices including a fin active region and methods of manufacturing the same.

Discussion of Related Art

As electronic devices become smaller and lighter, the demand for highly integrated semiconductor devices has increased. A short channel effect in a transistor may be generated due to the down-scaling of a semiconductor device, and thus reliability of the semiconductor device may be lowered. A semiconductor device including a fin active region has been developed to reduce the short channel effect. As design rules are reduced, a precise adjustment of a fabrication process of the semiconductor device including the fin active region becomes difficult.

SUMMARY

According to example embodiments of the inventive concepts, a semiconductor device may include a fin active region protruding from a substrate and extending in a first direction parallel to an upper surface of the substrate, a gate electrode on an upper surface and sidewalls of the fin active region and extending in a second direction across the fin active region, a gate spacer structure on a sidewall of the gate electrode, an upper surface of the gate spacer structure positioned at a higher level than an upper surface of the gate electrode relative to the upper surface of the substrate, an insulating capping layer on the gate electrode, of which a first portion has a first width greater than a second width of the gate electrode in the first direction, an insulating liner on a sidewall of the insulating capping layer and on the upper surface of the gate spacer structure and having a second thickness less than a first thickness of the gate spacer structure in the first direction, a source/drain region at a side of the gate electrode, and a self-aligned contact connected to the source/drain region. A sidewall of the self-aligned contact may contact the gate spacer structure and the insulating liner.

According to example embodiments of the inventive concepts, a semiconductor device may include a fin active region protruding from a substrate and extending in a first direction parallel to an upper surface of the substrate, a gate electrode covering an upper surface and sidewalls of the fin active region and extending in a second direction crossing the first direction, a gate spacer structure on opposite sidewalls of the gate electrode, an insulating capping layer on the gate electrode and extending in the second direction, an insulating liner on opposite sidewalls of the insulating capping layer and on an upper surface of the gate spacer structure, extending in the second direction and having a second thickness greater than a first thickness of the gate spacer structure, a native oxide layer between the insulating liner and the insulating capping layer, and a self-aligned contact at a side of the gate electrode. A sidewall of the self-aligned contact may be in contact with the gate spacer structure and the insulating liner.

According to example embodiments of the inventive concepts, a semiconductor device may include a substrate, a fin active region protruding from the substrate, the fin active region extending in a first direction, a gate electrode on the fin active region, the gate electrode extending in a second direction that crosses the first direction, a gate spacer structure on a sidewall of the gate electrode, an insulating capping layer on the gate electrode, the insulating capping layer including a first upper portion having a first width and a second lower portion having a second width, smaller than the first width, between the first portion and the substrate, and an insulating liner on an upper surface of the gate spacer and on a sidewall of the insulating capping layer, the insulating liner including a second thickness in the first direction that is smaller than a first thickness of the gate spacer structure in the first direction.

BRIEF DESCRIPTION OF THE DRAWINGS

The above and other objects, features and advantages of the present inventive concepts will become more apparent to those of ordinary skill in the art by describing in detail example embodiments thereof with reference to the accompanying drawings.

DETAILED DESCRIPTION

Various example embodiments of the present inventive concepts will now be described more fully with reference to the accompanying drawings in which some example embodiments are shown. However, the present inventive concepts may be embodied in many alternate forms and should not be construed as limited to only example embodiments set forth herein.

Figure 1:
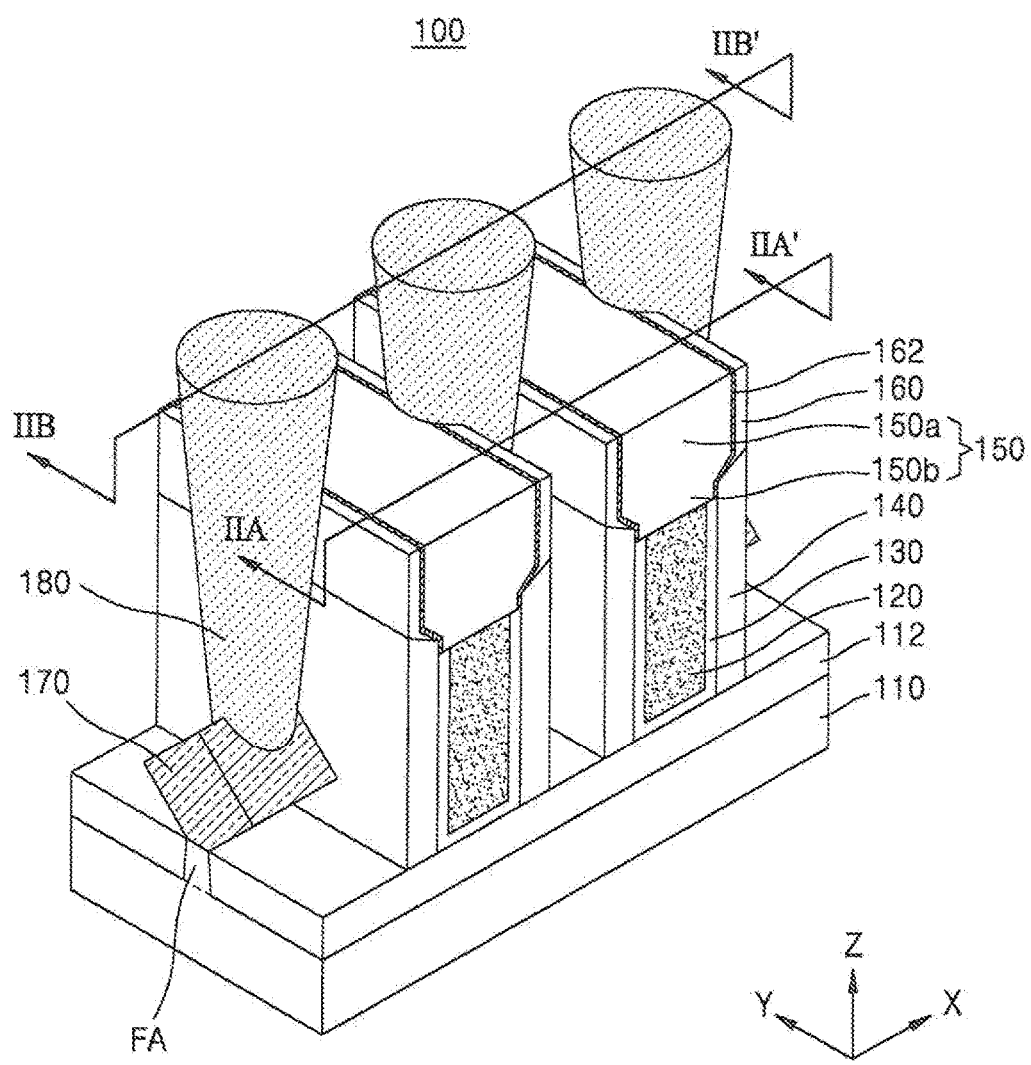
FIG. 1 is a perspective view illustrating a semiconductor device according to example embodiments of the present inventive concepts.
Figure 2:
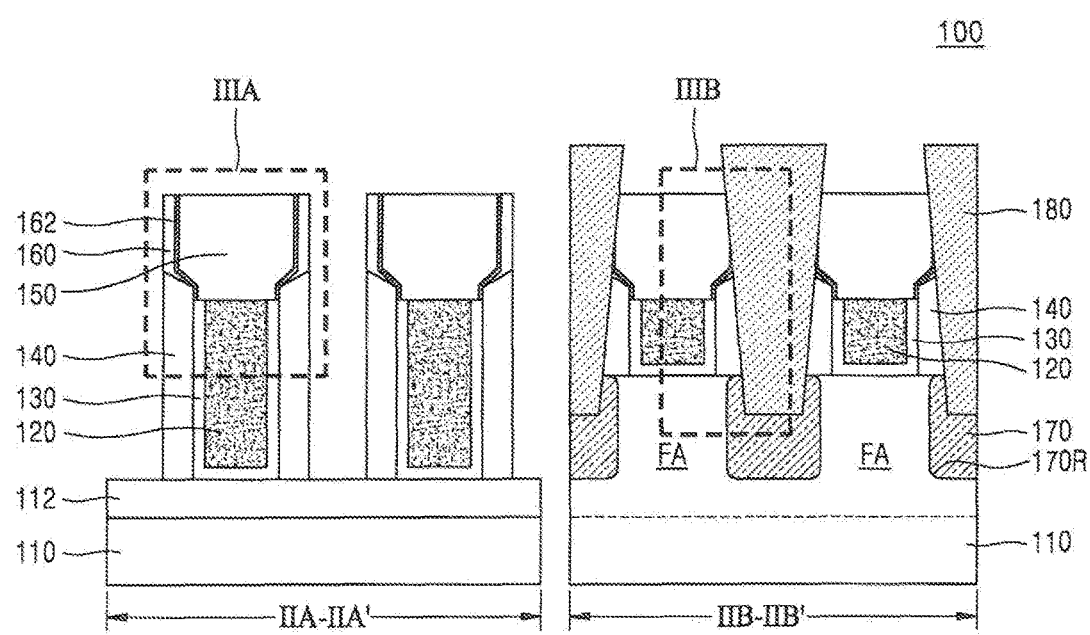
FIG. 2 is a cross-sectional view taken along lines IIA-IIA' and IIB-IIB' of FIG. 1, illustrating a semiconductor device according to example embodiments of the present inventive concepts.
Figure 3A:
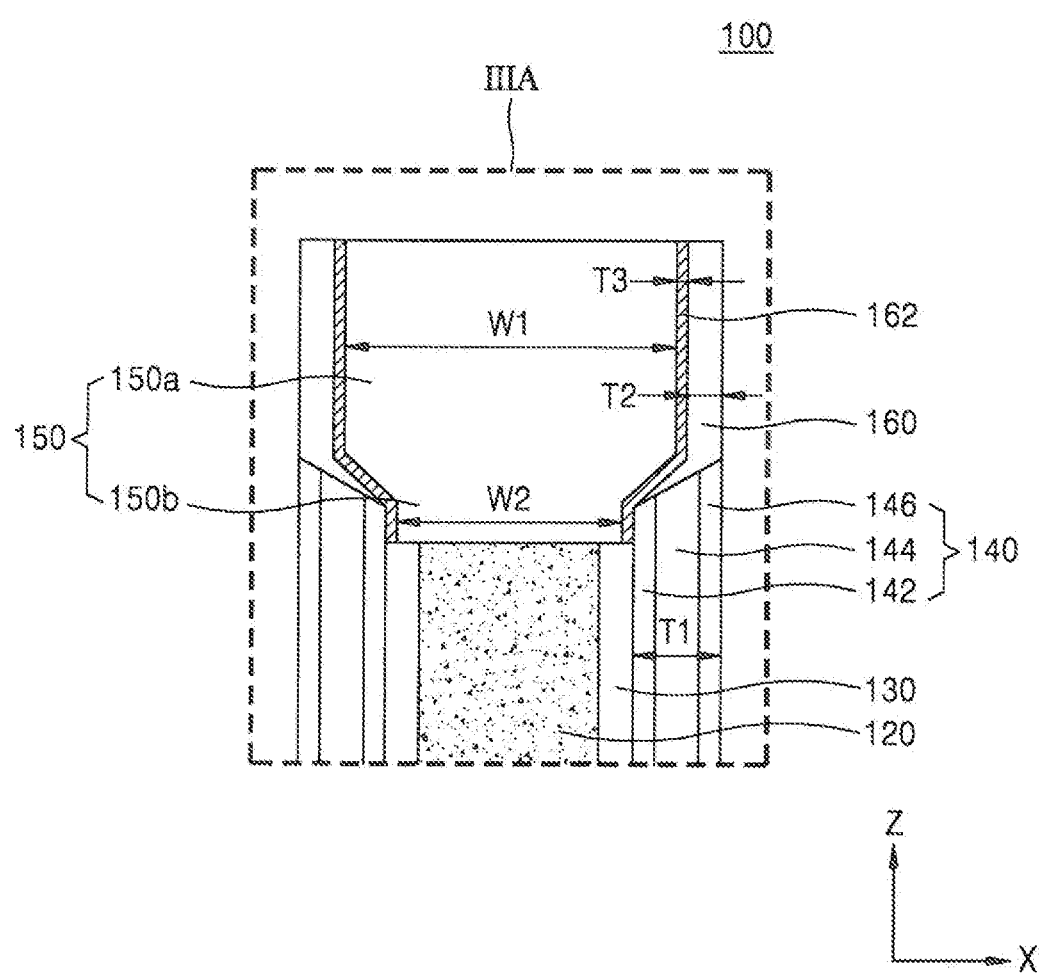
FIG. 3A is an enlarged view illustrating portion IIIA of FIG. 2.
Figure 3B:
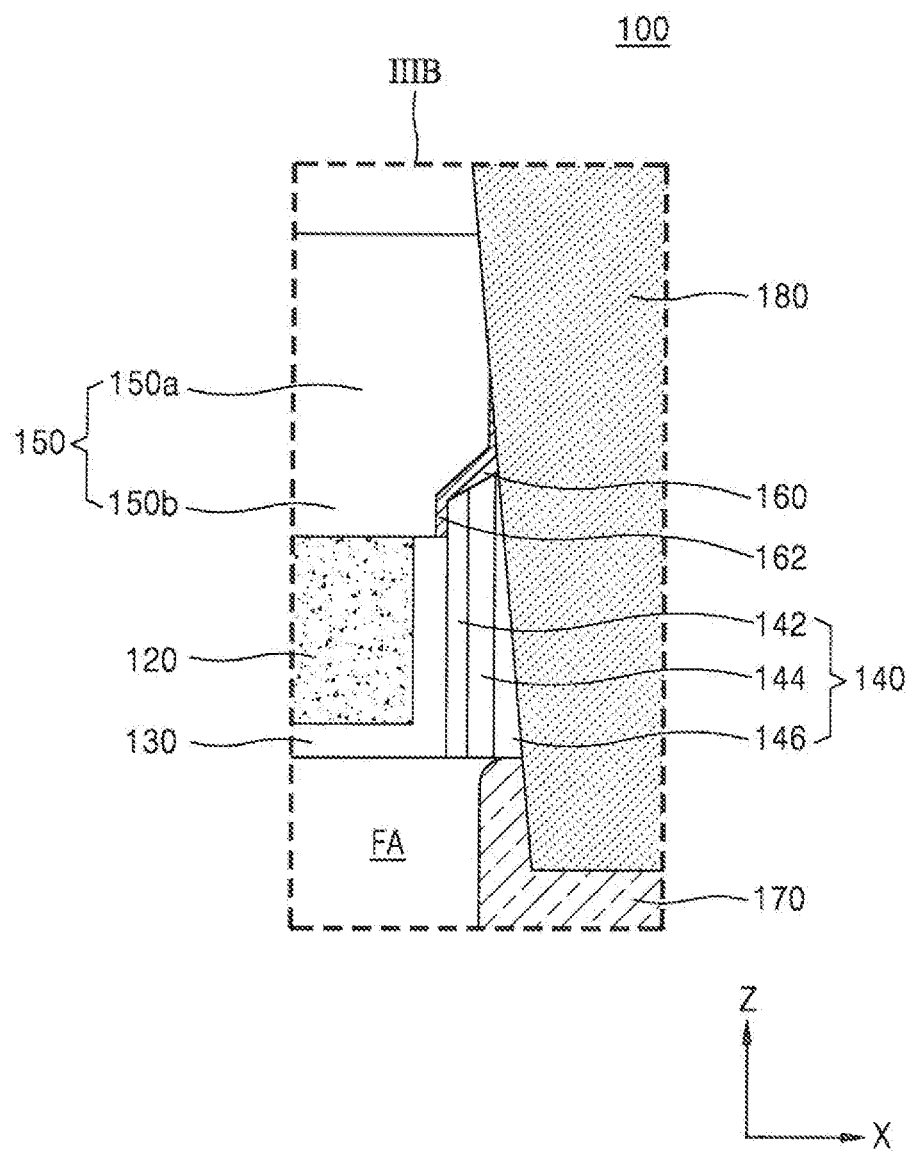
FIG. 3B is an enlarged view illustrating portion IIIB of FIG. 2.

FIG. 1 is a perspective view illustrating a semiconductor device 100 according to example embodiments of the present inventive concepts. FIG. 2 is a cross-sectional view taken along lines IIA-IIA' and IIB-IIB' of FIG. 1, illustrating the semiconductor device 100 according to example embodiments of the present inventive concepts. FIG. 3A is an enlarged view illustrating portion IIIA of FIG. 2, and FIG. 3B is an enlarged view illustrating portion IIIB of FIG. 2.

Referring to FIGS. 1, 2, 3A, and 3B, a fin active region FA may be disposed to protrude from the substrate 110. The fin active region FA may extend in a first direction (e.g., the X direction) parallel to an upper surface of the substrate 110. An isolation layer 112 may be disposed on the substrate 110 to cover lower portions of opposite sidewalls of the fin active region FA.

In some embodiments, the substrate 110 may include a group IV semiconductor such as Si and/or Ge, a group IV-IV compound semiconductor such as SiGe and/or SiC, or a group III-V compound semiconductor such as GaAs, InAs and/or InP. The substrate 110 may include a conductive region, such as, for example, an impurity-doped well and/or an impurity-doped structure. The fin active region FA may be used as an active region for a PMOS transistor or an NMOS transistor.

A gate electrode 120 may be disposed on the fin active region FA and the isolation layer 112 to extend in a second direction (e.g., the Y direction) parallel to the upper surface of the substrate 110 and crossing the first direction. In some embodiments, the second direction may be perpendicular to the first direction, but the present inventive concepts are not limited thereto. In some embodiments, the second direction may cross the first direction at an angle other than ninety degrees. The gate electrode 120 may be disposed on sidewalls and an upper surface of the fin active region FA and cross the fin active region FA. The gate electrode 120 may include, for example, Al, Cu, Ti, Ta, W, Mo, TaN, NiSi, CoSi, TiN, WN, TiAl, TiAlN, TaCN, TaC, TaSiN, and/or a combination thereof, but the present inventive concepts are not limited thereto. The gate electrode 120 may include a work function metal-containing layer and a gap fill metal layer. The work function metal-containing layer may include, for example, at least one of Ti, W, Ru, Nb, Mo, Hf, Ni, Co, Pt, Yb, Tb, Dy, Er, and Pd. The gap fill metal layer may include, for example, W and/or Al. In some embodiments, the gate electrode 120 may include a laminated structure of TiAlC/TiN/W, a laminated structure of TiN/TaN/TiAlC/TiN/W, or a laminated structure of TiN/TaN/TiN/TiAlC/TiN/W, but the present inventive concepts are not limited thereto.

The gate insulating layer 130 may be disposed on a lower surface and sidewalls of the gate electrode 120 to extend along the second direction. The gate insulating layer 130 may interposed between the gate electrode 120 and the fin active region FA and between the gate electrode 120 and an upper surface of the isolation layer 112. The gate insulating layer 130 may include, for example, silicon oxide, silicon oxynitride, a high-k dielectric material, and/or a combination thereof, but the present inventive concepts are not limited thereto. The high-k dielectric material may have a dielectric constant higher than that of silicon oxide. The high-k dielectric material may include, for example, metal oxide or metal oxynitride. For example, the high-k dielectric material may include $HfO_2$, HfSiO, HfSiON, HfTaO, HfTiO, HfZrO, zirconium oxide, aluminum oxide, $HfO_2$—$Al_2O_3$ alloy, and/or a combination thereof, but the present inventive concepts are not limited thereto.

A gate spacer structure 140 may be disposed on opposite sidewalls of the gate electrode 120. The gate spacer structure 140 may extend along an extension direction (e.g. the Y direction) of the gate electrode 120. The gate spacer structure 140 may include, for example, silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$) and/or a combination thereof. The gate spacer structure 140 may have a first thickness T1 ranging from about 1 to 30 nm in the first direction, as illustrated in FIG. 3A.

In some embodiments, the gate spacer structure 140 may include a structure in which multiple layers formed of different materials are stacked. For example, as shown in FIG. 3A, the gate spacer structure 140 may include a first spacer layer 142, a second spacer layer 144, and a third spacer layer 146 that are sequentially stacked on the sidewalls of the gate electrode 120. The first spacer layer 142 and the third spacer layer 146 may include, for example, silicon nitride. The second spacer layer 144 may include, for example, a material having a dielectric constant lower than that of the first and third spacer layers 142 and 146. For example, the second spacer layer 144 may include silicon oxycarbonitride ($SiO_xC_yN_z$). In some embodiments, when the gate spacer structure 140 includes the second spacer layer 144 including the material having a lower dielectric constant, a parasitic capacitance caused by the gate spacer structure 140 may be reduced. The first to third spacer layers 142, 144, and 146 are not limited to the above-described materials.

As shown in FIG. 3A, an upper surface of the gate spacer structure 140 may be higher than an upper surface of the gate electrode 120 relative to the upper surface of the substrate 110. The upper surface of the gate spacer structure 140 may be sloped. Thus, a height of the upper surface of the gate spacer structure 140 adjacent a sidewall of the gate electrode 120 may increase with an increasing distance away from the sidewall of the gate electrode 120. In some embodiments, the upper surface of the gate spacer structure 140 may be flat. In some embodiments, the upper surface of the gate spacer structure 140 may be substantially coplanar with the upper surface of the gate electrode 120.

An insulating capping layer 150 may be disposed on the gate electrode 120. The insulating capping layer 150 may cover the upper surface of the gate electrode 120 and may extend in the second direction. In some embodiments, the insulating capping layer 150 may include silicon nitride. The insulating capping layer 150 may act as a mask for forming a self-aligned contact.

An insulating liner 160 may be disposed on opposite sidewalls of the insulating capping layer 150. The insulating liner 160 may extend in the second direction, and a lower surface of the insulating liner 160 may contact the upper surface of the gate spacer structure 140. In some embodiments, the insulating liner 160 may include silicon nitride.

In some embodiments, segments of the insulating liner 160 may have a second thickness T2 ranging from about 0.5 to 20 nm in a first direction. The second thickness T2 of the insulating liner 160 may be smaller than the first thickness T1 of the gate spacer structure 140.

A native oxide layer 162 may be disposed between the insulating capping layer 150 and the insulating liner 160 and/or between the insulating capping layer 150 and the gate spacer structure 140. For example, the native oxide layer 162 may have a third thickness T3 ranging from about 1 to 10 Å.

The native oxide layer 162 may include oxide that is formed from a portion of the insulating liner 160, a portion of the gate spacer structure 140, and/or a portion of a second sacrificial gate 226 (refer to, e.g., FIG. 1). In an example process for forming the gate electrode 120 and the insulating capping layer 150, the gate spacer structure 140 may be formed on sidewalls of a first sacrificial gate 222 (refer to, e.g., FIG. 10), an upper portion of the gate spacer structure 140 and an upper portion of the first sacrificial gate 222 may be removed to form a first recess region 220R1 (refer to, e.g., FIG. 10), and then the insulating liner 160 may be formed on the gate spacer structure 140. Thereafter, the second sacrificial gate 226 (refer to, e.g., FIG. 11) may be formed in the first recess region 220R1 to form a sacrificial gate stack 220 (refer to, e.g., FIG. 11) having a T-shape. The gate electrode 120 and the insulating capping layer 150 may be sequentially formed in a region from which the sacrificial gate stack 220 is removed. The native oxide layer 162 may be formed to a predetermined thickness on a surface of the insulating liner 160 and/or a surface of the gate spacer structure 140 exposed in the process of removing the sacrificial gate stack 220 and/or a process of forming the gate electrode 120.

As shown in FIG. 3A, outer sidewalls (e.g. sidewalls farthest from the gate electrode 120) of the gate spacer structure 140 and the insulating liner 160 may be aligned with each other. Since the first thickness T of the gate spacer structure 140 may be greater than the second thickness T2 of the insulating liner 160, the insulating capping layer 150 may have the T-shape in which an upper width thereof is greater than a lower width thereof. For example, a first portion 150a of the insulating capping layer 150 may be disposed between a pair of the insulating liners 160, and a second portion 150b of the insulating capping layer 150 may be disposed between a pair of the gate spacer structures 140. In some embodiments, a portion of the insulating liner 160 may be disposed between the upper surface of the gate spacer structure 140 and the first portion 150a of the insulating capping layer 150. In some embodiments, the first portion 150a of the insulating capping layer 150 may be positioned at a higher level than the upper surface of the gate spacer structure 140 relative to the upper surface of the substrate 110, and a second portion 150b of the insulating capping layer 150 may be positioned at a lower level than the upper surface of the gate spacer structure 140 relative to the upper surface of the substrate 110. The first portion 150a of the insulating capping layer 150 may have a first width W1. The second portion 150b of the insulating capping layer 150 may have a second width W2 smaller than the first width W1. In some embodiments, the insulating capping layer 150 may include an intermediate portion disposed between and connecting the first portion 150a and the second portion 150b. The intermediate portion may have a varying width ranging from the first width W1 to the second width W2.

Figure 10:
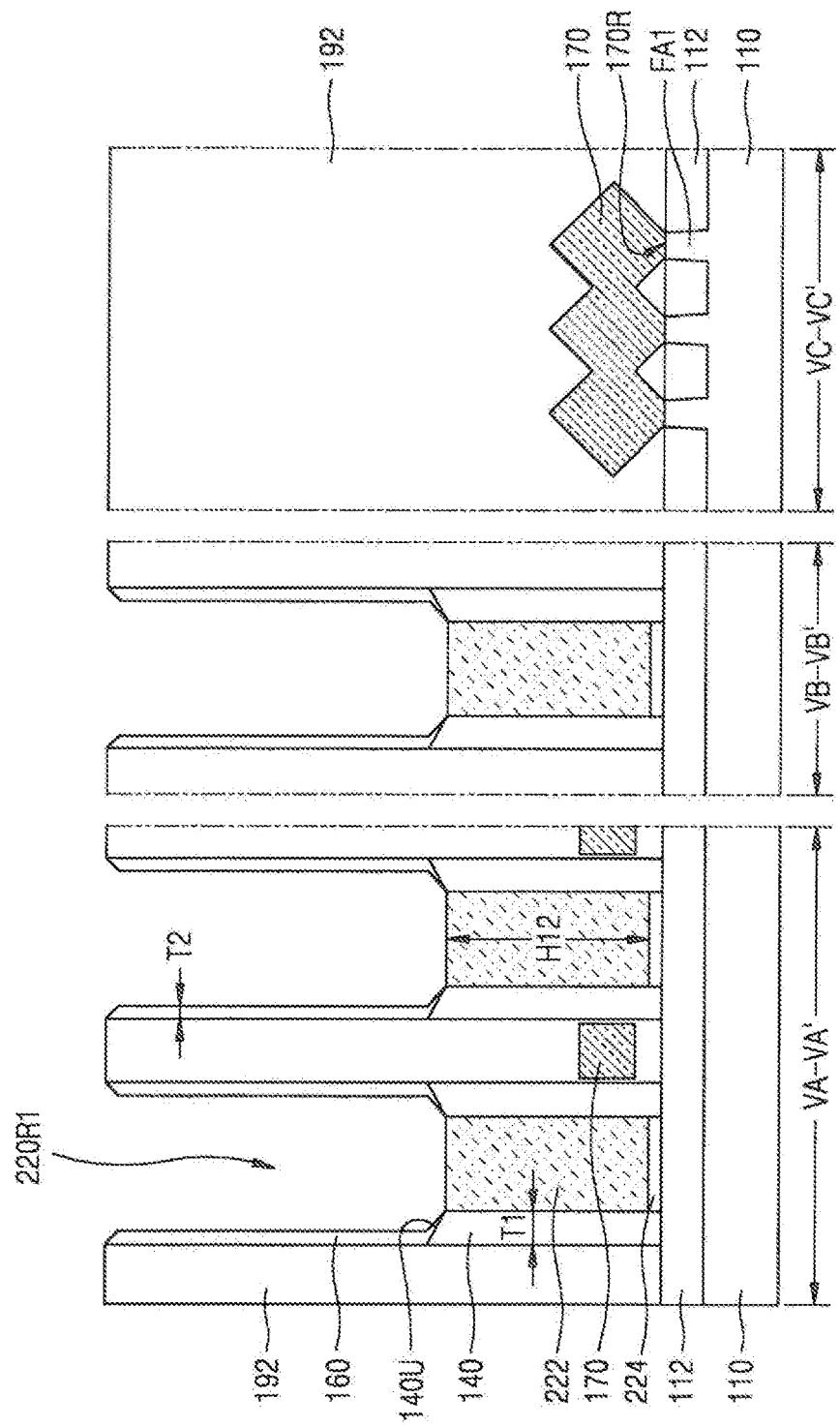

The T-shape of the insulating capping layer 150 may be obtained by removing an upper portion of the first sacrificial gate 222 to a predetermined thickness and performing the recess process for forming the first recess region 220R1 (refer to, e.g., FIG. 10). As described above, when forming the first recess region 220R1 by removing the upper portion of the first sacrificial gate 222, an upper portion of the gate spacer structure 140 may also be removed. Thereafter, the gate electrode 120 and the insulating capping layer 150 may be formed in the region from which the sacrificial gate stack 220 having the T-shape is removed, for example, in the second recess region 220R12 (refer to, e.g., FIG. 16). In this case, a height of the gate electrode 120 may be lower than a height of the upper surface of the gate spacer structure 140, and thus the insulating capping layer 150 filling a remaining portion of the second recess region 220R2 (refer to, e.g., FIG. 17) may include an upper portion having a first width W1 and a lower portion having a second width W2 different from the first width W1. The first width W1 may be greater than the second width W2.

A source/drain region 170 may be disposed on the fin active region FA at opposite sides of the gate electrode 120. The source/drain region 170 may include, for example, a doped SiGe layer, a doped Ge layer, a doped SiC layer, and/or a doped InGaAs layer, but the present inventive concepts are not limited thereto. The source/drain region 170 may be formed by removing a portion of the fin active region FA at the opposite sides of the gate electrode 120 to form a recess 170R and growing the semiconductor layer in the recess 170R by an epitaxial growth process to fill the recess 170R (refer to, e.g., FIG. 7).

For example, when the fin active region FA is an active region for an NMOS transistor, the source/drain region 170 may include a doped SiC layer, and when the fin active region FA is an active region for a PMOS transistor, the source/drain region 170 may include a doped SiGe layer.

In some embodiments, the source/drain region 170 may include multiple semiconductor layers having different compositions. For example, the source/drain region 170 may include a lower semiconductor layer, an upper semiconductor layer, and/or a capping semiconductor layer. The lower semiconductor layer, the upper semiconductor layer and/or the capping semiconductor layer may include SiGe in which Si content is different from Ge content.

A contact 180 may be disposed on the source/drain region 170 and may be connected to the source/drain region 170. In some embodiments, the contact 180 may be a self-aligned contact. A portion of a sidewall of the contact 180 may be aligned with the outer sidewall of the gate spacer structure 140. For example, a lower sidewall of the contact 180 may contact the outer sidewall of the gate spacer structure 140. In some embodiments, an upper portion of the contact 180 may contact the insulating capping layer 150 and/or the insulating liner 160.

In some embodiments, the contact 180 may include, for example, tungsten (W), cobalt (Co), and/or silicide thereof. A barrier layer may be further disposed between the contact 180 and the gate spacer structure 140 and between the contact 180 and the insulating capping layer 150 and/or the insulating liner 160. The barrier layer may include, for example, Ti, Ta, TiN, TaN, and/or a combination thereof.

In some embodiments, the contact 180 may not contact the second spacer layer 144 of the gate spacer structure 140. In the example process for forming the gate electrode 120 and the insulating capping layer 150, when forming the first recess region 220R1 by removing the upper portion of the first sacrificial gate 222, an upper portion of the gate spacer structure 140 may also be removed (refer to, e.g., FIG. 9). As the height of the gate spacer structure 140 is reduced in the recess process of the first sacrificial gate 222, an upper surface of the gate spacer structure 140 may not be exposed in the following etching process for forming the contact 180. If the second spacer layer 144 including the relatively low dielectric constant material were to be exposed to the etching process, the second spacer layer 144 may be etched or consumed. However, according to the example embodiments, since the upper surface of the gate spacer structure 140 may not be exposed in the etching process for forming the contact 180, damage to the gate spacer structure 140 may be reduced or prevented.

As a width of the gate electrodes and a distance therebetween in a semiconductor device are reduced, an electrical insulation between the gate electrode and an adjacent contact may not be sufficiently secured. Thus, a method of forming an active contact as a self-aligned contact may be performed using the insulating capping layer and the gate spacer structure as a self-aligned mask. Here, to secure a process margin for forming the self-aligned contact, the insulating layer may be formed to have a sufficient height, and also a sacrificial gate may be formed to have a sufficient height.

However, as a design rule is reduced, since a width of the sacrificial gate is reduced and a height thereof increases, an aspect ratio (i.e., a ratio of a height to the upper width) of an opening in the sacrificial gate removing process and the gate electrode forming process may be significantly increased. In this case, an etchant or a source material may not be sufficiently supplied such that the sacrificial gate removing process, the source/drain region forming process, and/or the gate electrode forming process may not be precisely adjusted. Accordingly, a difference between electrical characteristics of the transistors may increase.

Figure 11:
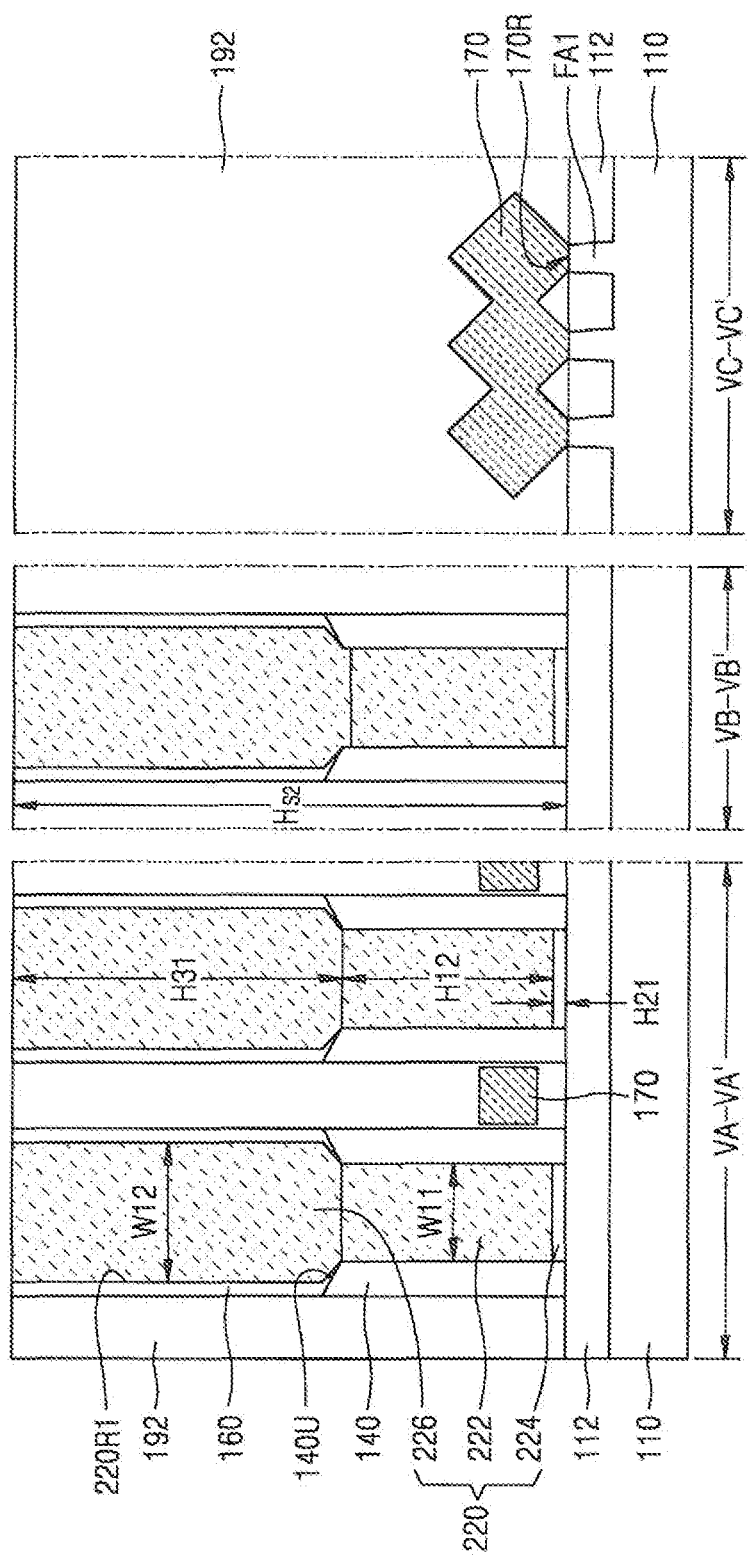

However, in the method of manufacturing the semiconductor device 100 according to the example embodiments of the present inventive concepts, by forming the sacrificial gate stack 220 having the T-shape, the initial sacrificial gate having the relatively lower height, e.g., the first sacrificial gate 222, may be used (refer to, e.g., FIG. 11). Furthermore, an upper portion of the opening (e.g., the first recess region 220R1) may be enlarged by the process of recessing the first sacrificial gate 222 for forming the sacrificial gate stack 220 having the T-shape (refer to, e.g., FIG. 9). Thus, an aspect ratio of the opening may be reduced, and a precision in the sacrificial gate removing process, the source/drain region forming process, and/or the gate electrode forming process may be increased. Accordingly, a difference between electrical characteristics of the semiconductor device 100 may be reduced.

Figure 4:
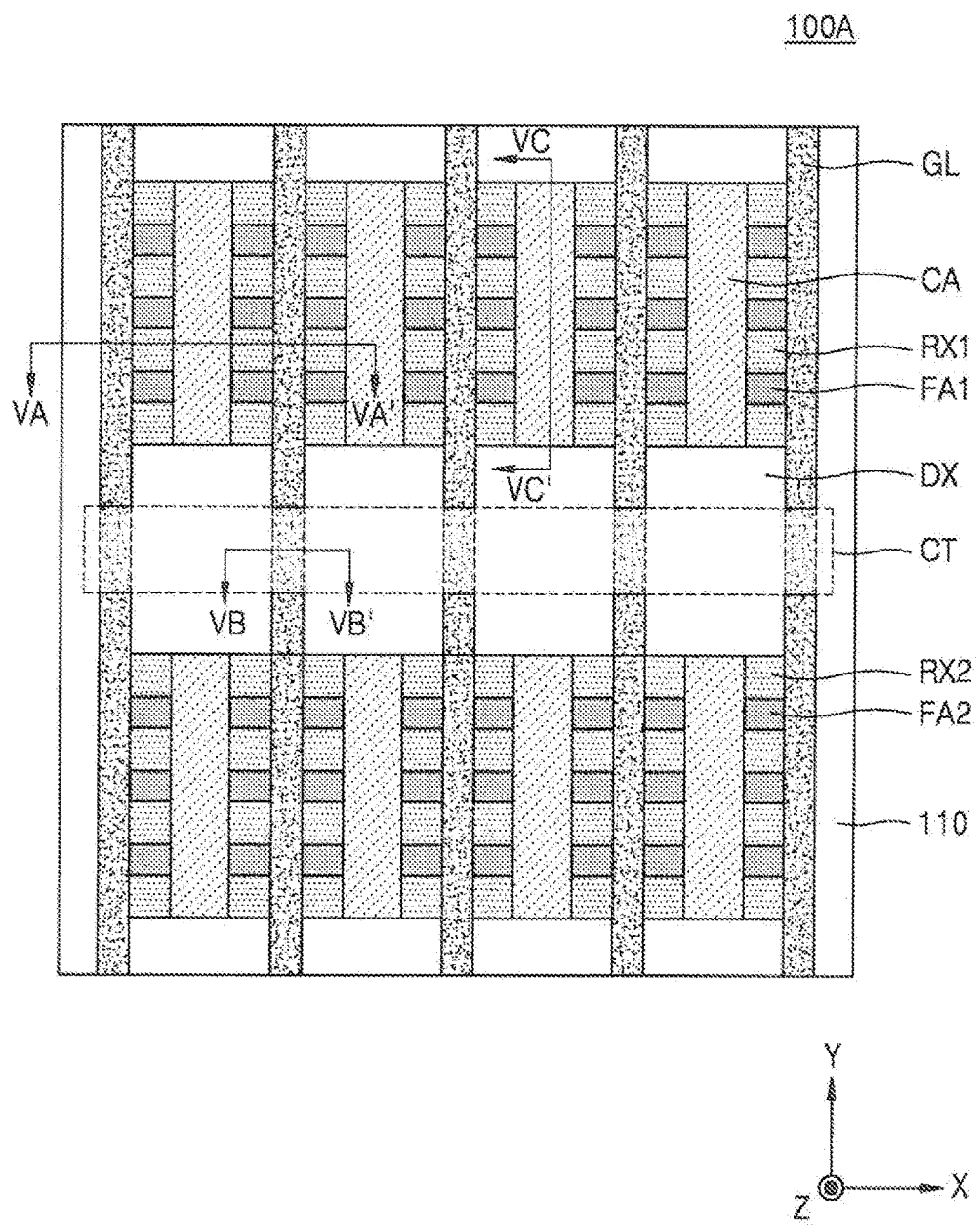
FIG. 4 is a layout diagram illustrating a semiconductor device according to example embodiments of the present inventive concepts.
Figure 5:
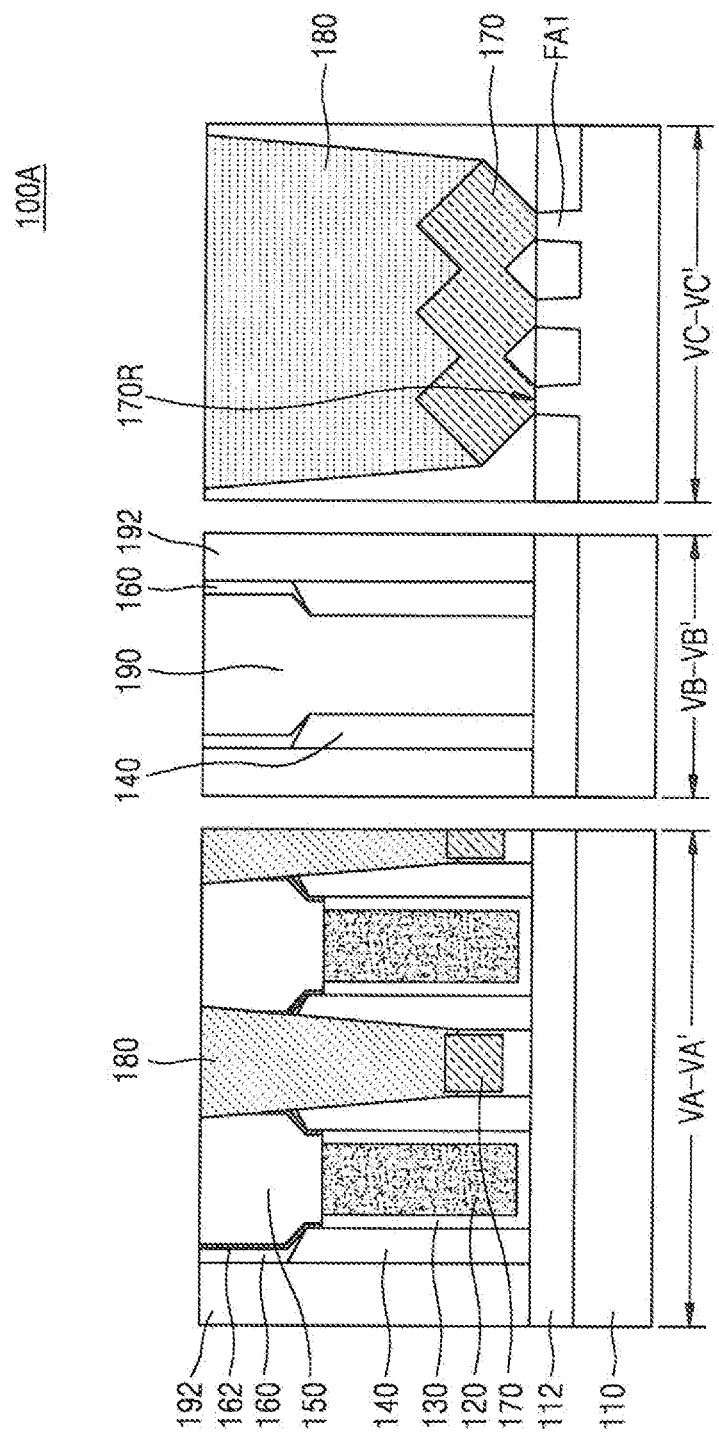
FIG. 5 is a cross-sectional view, taken along lines VA-VA', VB-VB', and VC-VC' of FIG. 4, illustrating a semiconductor device according to example embodiments of the present inventive concepts.

FIG. 4 is a layout diagram illustrating a semiconductor device 100A according to example embodiments of the present inventive concepts. FIG. 5 is a cross-sectional view, taken along lines VA-VA', VB-VB' and VC-VC' of FIG. 4, illustrating the semiconductor device 100A according to example embodiments of the present inventive concepts. In FIGS. 4 and 5, the same reference numerals are used to denote the same or similar elements as in FIGS. 1, 2, 3A and 3B.

Referring to FIGS. 4 and 5, a substrate 110 may include a first active region RX1 and a second active region RX2 and a dummy region DX between the first and second active regions RX1 and RX2. A plurality of first fin active regions FA1 may be disposed in the first active region RX1 to extend in a first direction (e.g., the X direction) parallel to an upper surface of the substrate 110. A plurality of second active regions FA2 may be disposed in the second active region RX2 to extend in the first direction.

In some embodiments, the first and second active regions RX1 and RX2 may be regions in which different types of transistors are formed, respectively. For example, the first active region RX1 may be a region in which a PMOS transistor is formed, and the second active region RX2 may be a region in which an NMOS transistor is formed. In other embodiments, the first and second active regions RX1 and RX2 may be regions in which the same types of transistors are formed. For example, the first active region RX1 may be a region in which a first NMOS transistor having a first threshold voltage is formed, and the second active region RX2 may be a region in which a second NMOS transistor having a second threshold voltage, different from the first threshold voltage, is formed.

A gate line GL may extend in a second direction (e.g., the Y direction) and may cross the first fin active regions FA1 and/or the second fin active regions FA2. The gate line GL may be referred to as a gate electrode 120. The gate electrode 120 may be the same or similar as described with reference to FIGS. 1, 2, 3A and 3B.

A gate spacer structure 140 may be disposed on opposite sidewalls of the gate electrode 120. An insulating capping layer 150 may be disposed on an upper surface of the gate electrode 120. An insulating liner 160 may be disposed on opposite sidewalls of the insulating capping layer 150. A lower surface of the insulating liner 160 may contact an upper surface of the gate spacer structure 140. A native oxide layer 162 may be disposed between the insulating capping layer 150 and the insulating liner 160 and between the insulating capping layer 150 and the gate spacer structure 140. The gate spacer structure 140, the insulating capping layer 150, the insulating liner 160, and the native oxide layer 162 may be the same or similar as described with reference to FIGS. 1, 2, 3A and 3B.

The gate line GL may be separated in a line cut region CT. For example, the gate line GL intersecting the first active region RX1 and the gate line GL intersecting the second active region RX2 may be arranged in a line with the line cut region interposed therebetween. Such a structure may be obtained by forming the gate line GL intersecting both the first active region RX1 and the second active region RX2, forming a second hard mask pattern 230 (refer to FIG. 12) exposing the line cut region CT, and removing a portion of the gate line GL overlapped with the line cut region CT using the second hard mask pattern 230 as an etch mask. As shown in FIG. 4, five gate lines GL may be arranged not to be overlapped with the line cut region CT. However, the present inventive concepts are not limited thereto. For example, at least one of the gate lines GL may be overlapped with the line cut region CT, and the at least one of the gate lines GL may extend in the second direction to intersect both the first active region RX1 and the second active region RX2.

As shown in FIG. 5, the gate spacer structure 140 and the insulating liner 160 may be disposed in the line cut region CT. A line gap-fill insulating layer 190 may be disposed in a portion of the line cut region CT from which the gate line GL is removed. The line gap-fill insulating layer 190 may include, for example, silicon nitride. The gate spacer structure 140 on sidewalls of the line gap-fill insulating layer 190 may be connected to the gate spacer structure 140 on the sidewalls of the gate line GL. For example, the gate spacer structure 140 may extend from the first active region RX1 to the line cut region CT in the second direction and may also extend to the second active region RX2.

An upper surface of the gate spacer structure 140 on the sidewalls of the line gap-fill insulating layer 190 may be substantially positioned at the same level as the upper surface of the gate spacer structure 140 on the gate electrode 120 relative to the upper surface of the substrate 110. In the method of manufacturing the semiconductor device 100A, when performing the recess process for removing the upper portion of the first sacrificial gate 222 (refer to, e.g., FIG. 10) and the upper portion of the gate spacer structure 140 to form the sacrificial gate stack 220 (refer to, e.g., FIG. 11) having a T-shape, the upper portion of the first sacrificial gate 222 and the upper portion of the gate spacer structure 140 in the line cut region CT may also be concurrently removed, such that the whole upper surface of the gate spacer structure 140 may be substantially positioned at the same level relative to the upper surface of the substrate 110.

An insulating liner 160 may be disposed on the sidewalls of the line gap-fill insulating layer 190. A portion of the insulating liner 160 on the sidewalls of the line gap-fill insulating layer 190 may be connected to a portion of the insulating liner 160 on the sidewalls of the insulating capping layer 150. In some embodiments, the insulating liner 160 on the sidewalls of the line gap-fill insulating layer 190 and/or the insulating liner 160 on the sidewalls of the insulating capping layer 150 may be formed by the same process. In this case, the insulating liner 160 on the sidewalls of the line gap-fill insulating layer 190 and/or the insulating liner 160 on the sidewalls of the insulating capping layer 150 may include substantially the same material and/or have substantially the same thickness. However, the present inventive concepts are not limited thereto.

An active contact CA may be disposed between two adjacent gate lines GL and may extend in the second direction. The active contact CA may be a self-aligned contact formed using the gate spacer structure 140, the insulating capping layer 150, and the insulating liner 160 as a self-aligned mask. The active contact CA may be referred to as a contact 180. The contact 180 may be the same as described in FIGS. 1, 2, 3A and 3B.

An inter-gate insulating layer 192 may be disposed on the substrate 110 to cover a sidewall of the gate spacer structure 140 and sidewalls of the contact 180. The inter-gate insulating layer 192 may include, for example, tetraethyl orthosilicate (TEOS) layer and/or an ultra low-k dielectric (ULK) layer. The ULK layer may include a SiOC layer and/or a SiCOH layer In some embodiments, a capping pattern 252 (refer to FIG. 19) may be further disposed on the inter-gate insulating layer 192. For example, the capping pattern 252 may include silicon nitride. The capping pattern 252 may act as a protection layer for preventing damage of the inter-gate insulating layer 192 during a process of forming a contact hole 180H (refer to e.g., FIG. 20) to form the contact 180.

FIGS. 6 to 20 are cross-sectional views illustrating a method of manufacturing a semiconductor device 100A according to example embodiments of the present inventive concepts. FIGS. 6 to 20 illustrate cross-sections taken along lines VA-VA', VB-VB', and VC-VC' of FIG. 4 according to stages of the method of manufacturing the semiconductor device 100A. In FIGS. 6 to 20, a part of the semiconductor device 100A formed in the first active region RX1 of FIG. 4 is illustrated and described for brevity of explanation. Thus, descriptions thereof may similarly apply to corresponding portions of the semiconductor device 100A in the second active region RX2 of FIG. 4. In FIGS. 6 to 20, the same reference numerals are used to denote the same or similar elements as in FIGS. 1 to 5.

Figure 6:
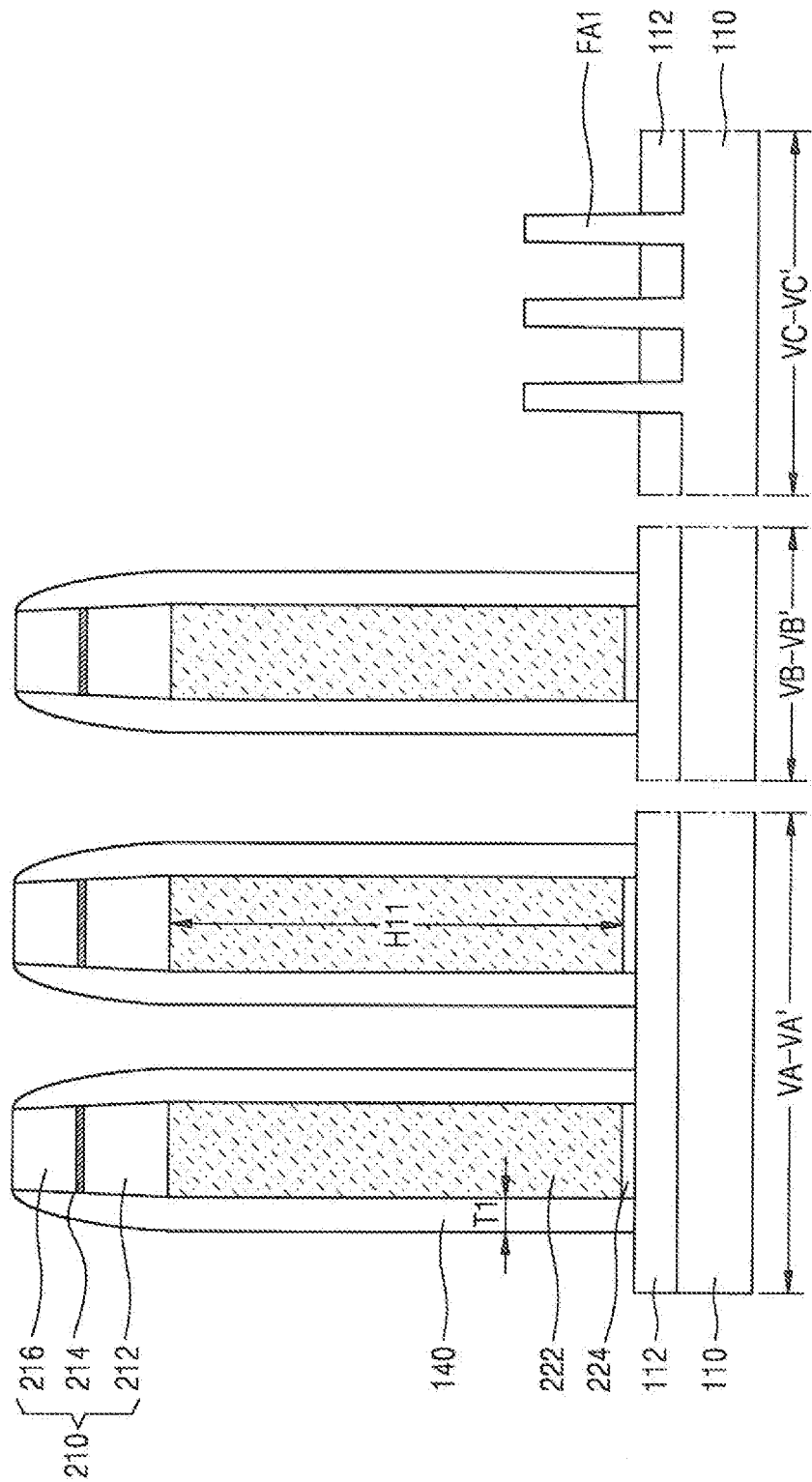
FIGS. 6 to 20 are cross-sectional views illustrating a method of manufacturing a semiconductor device according to example embodiments of the present inventive concepts.

Referring to FIG. 6, a portion of a substrate 110 in the first active region RX1 may be removed such that a fin active region FA1 is formed to upwardly protrude from the substrate 110 and extend in a first direction (e.g., the X direction in FIG. 4).

An isolation layer 112 may be formed on the substrate 110 to cover opposite sidewalls of the fin active region FA1. An interface layer may be further formed between the isolation layer 112 and the fin active region FA1 to cover conformally the sidewalls of the fin active region FA1.

Thereafter, after a sacrificial gate insulating layer, a sacrificial gate conductive layer, and a first hard mask pattern 210 are sequentially formed on the substrate 110, the sacrificial gate conductive layer and the sacrificial gate insulating layer may be patterned using the first hard mask pattern 210 as an etch mask to form a first sacrificial gate 222 and a sacrificial gate insulating pattern 224.

In some embodiments, the first hard mask pattern 210 may include a lower capping layer 212, a first etch stop layer 214 and an upper capping layer 216 that are sequentially stacked. The lower capping layer 212 and the upper capping layer 216 may include a material having an etch selectivity with respect to the first etch stop layer 214. For example, the lower capping layer 212 and the upper capping layer 216 may include silicon nitride, and the first etch stop layer 214 may include polysilicon. However, the present inventive concepts are not limited thereto.

In some embodiments, the first sacrificial gate 222 may include polysilicon, and the sacrificial gate insulating pattern 224 may include silicon oxide.

The first sacrificial gate 222 may be formed to have a first height H11. The first height H11 may range from 50 to 300 nm, but is not limited thereto. The first sacrificial gate 222 may be formed to have a relatively small first height H11 by using the first hard mask pattern 210 including the first etch stop layer 214.

As the height of the first sacrificial gate 222 increases, an aspect ratio of a second recess region 220R2 (refer to, e.g., FIG. 16) may increase in subsequent processing, for example, in a process of removing the first sacrificial gate 222 and/or in a process of filling the second recess region 220R2, from which the first sacrificial gate 222 is removed, with the gate electrode 120, In conventional processing techniques, an etchant or a source material may not be smoothly supplied into the second recess region 220R2. As used herein, a phenomenon in which the etchant or the source material is not locally smoothly supplied into the second recess region 220R2 may be referred to as a loading effect.

However, according to the example embodiments of the present inventive concepts, when the first sacrificial gate 222 is formed to have the relatively small first height H11 by the use of the first hard mask pattern 210 including the first etch stop layer 214, the aspect ratio of the second recess region 220R2 may be reduced such that the loading effect in the subsequent processing may be reduced and/or prevented.

Thereafter, an insulating layer covering the first hard mask pattern 210, the first sacrificial gate 222 and the sacrificial gate insulating pattern 224 may be formed by an atomic layer deposition (ALD) process or a chemical vapor deposition (CVD) process. The insulating layer may be anisotropically etched to form a gate spacer structure 140 on sidewalls of the first hard mask pattern 210, on sidewalls of the first sacrificial gate 222, and on sidewalls of the sacrificial gate insulating pattern 224.

In some embodiments, the gate spacer structure 140 may be formed in the laminated structure of the first to third spacer layers 142, 144, and 146 as shown in FIG. 3A. For example, the first and third spacer layers 142 and 146 may include silicon nitride, and the second spacer layer 144 may include a material having a lower dielectric constant than the first and third spacer layers 142 and 146, for example, $SiO_xC_yN_z$. In some embodiments, the gate spacer structure 140 may have a first thickness T1 ranging from about 1 to 30 nm.

Figure 7:
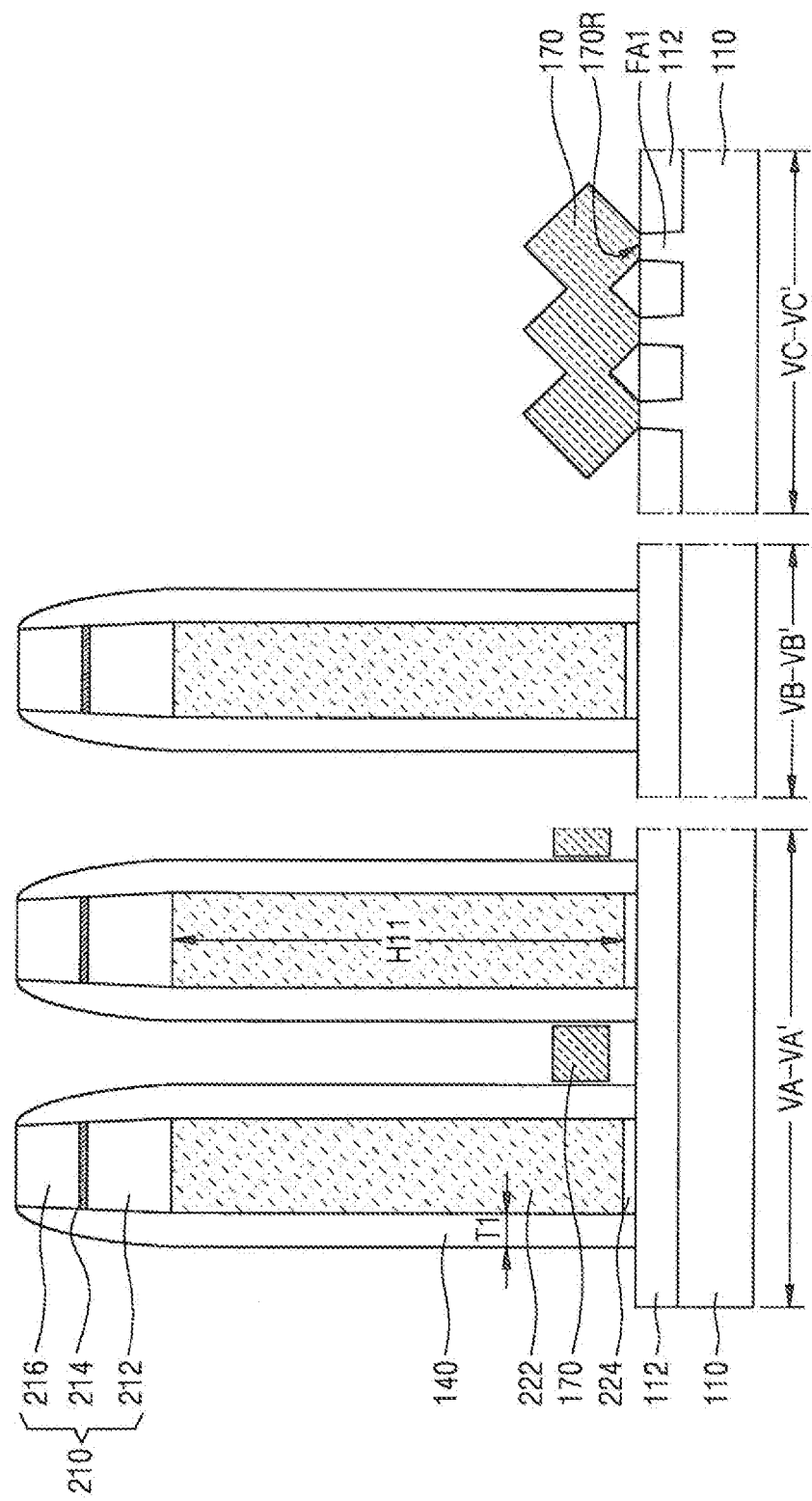

Referring to FIG. 7, a portion of the fin active region FA1 at opposite sides of the first sacrificial gate 222 may be etched to form a recess 170R. A source/drain region 170 may be formed in the recess 170R.

In some embodiments, the source/drain region 170 may be formed by an epitaxial growth process using the fin active region FA1 exposed by the recess 170R as a seed. The epitaxial growth process may include a vapor phase epitaxy (VPE) process, a CVD process such as ultra-high CVD process, a molecular beam epitaxy process, or a combination thereof. In the above epitaxial growth process, a liquid or vapor precursor may be used as a precursor for forming the source/drain region 170.

The source/drain region 170 may be formed to have various shapes by controlling a growth condition in the epitaxial growth process. For example, the source/drain region 170 may have a polygonal shape in which planes inclined at a predetermined angle are connected to one another. However, the source/drain region 170 is not limited thereto. For example, the source/drain region 170 may have various shapes depending on a material configuring the fin active region FA1, a material configuring the source/drain region 170, process conditions of the epitaxial growth process, etc.

Figure 8:
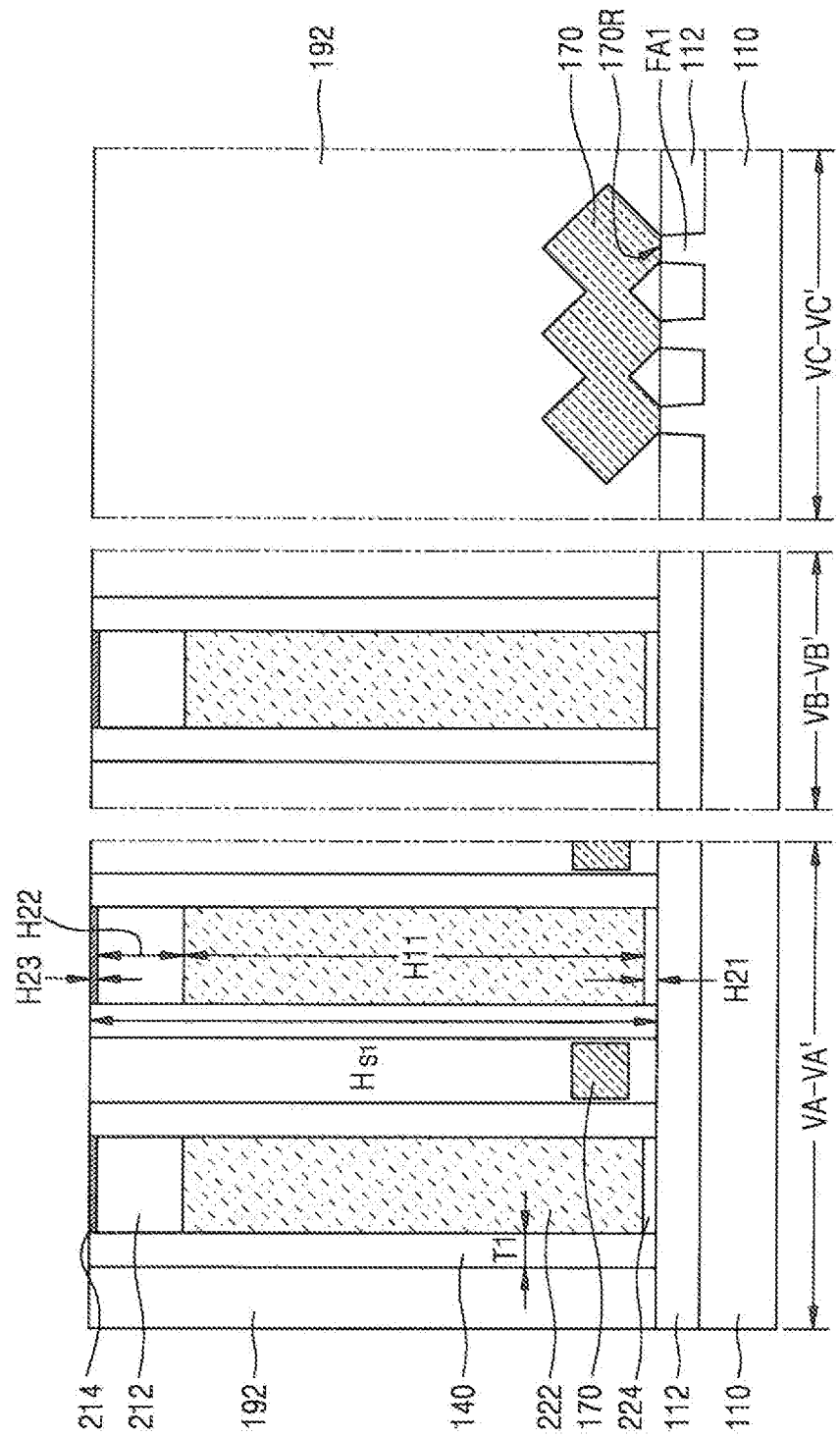

Referring to FIG. 8, an insulating layer may be formed on the substrate 110 to cover the gate spacer structure 140 and the first hard mask pattern 210, and the insulating layer may be planarized until exposing an upper surface of the first etch stop layer 214 to form an inter-gate insulating layer 192.

In some embodiments, the first etch stop layer 214 may include a material having an etch selectivity with respect to the upper capping layer 216 and/or the inter-gate insulating layer 192, and an upper portion of the insulating layer may be planarized until exposing the upper surface of the first etch stop layer 214, thereby forming the inter-gate insulating layer 192. The first etch stop layer 214 may be made of, for example, polysilicon.

Here, a sum of a height H21 of the sacrificial gate insulating pattern 224, a height H11 of the first sacrificial gate 222, a height H22 of the lower capping layer 212, and a height H23 of the first etch stop layer 214 may be referred to as an initial height $H_{S1}$ of an initial sacrificial gate stack. As the initial sacrificial gate stack having the initial height $H_{S1}$ includes the lower capping layer 212, the first sacrificial gate 222 may be formed to have a relatively small height H11 such that a process precision in the following processes may be enhanced.

Figure 9:
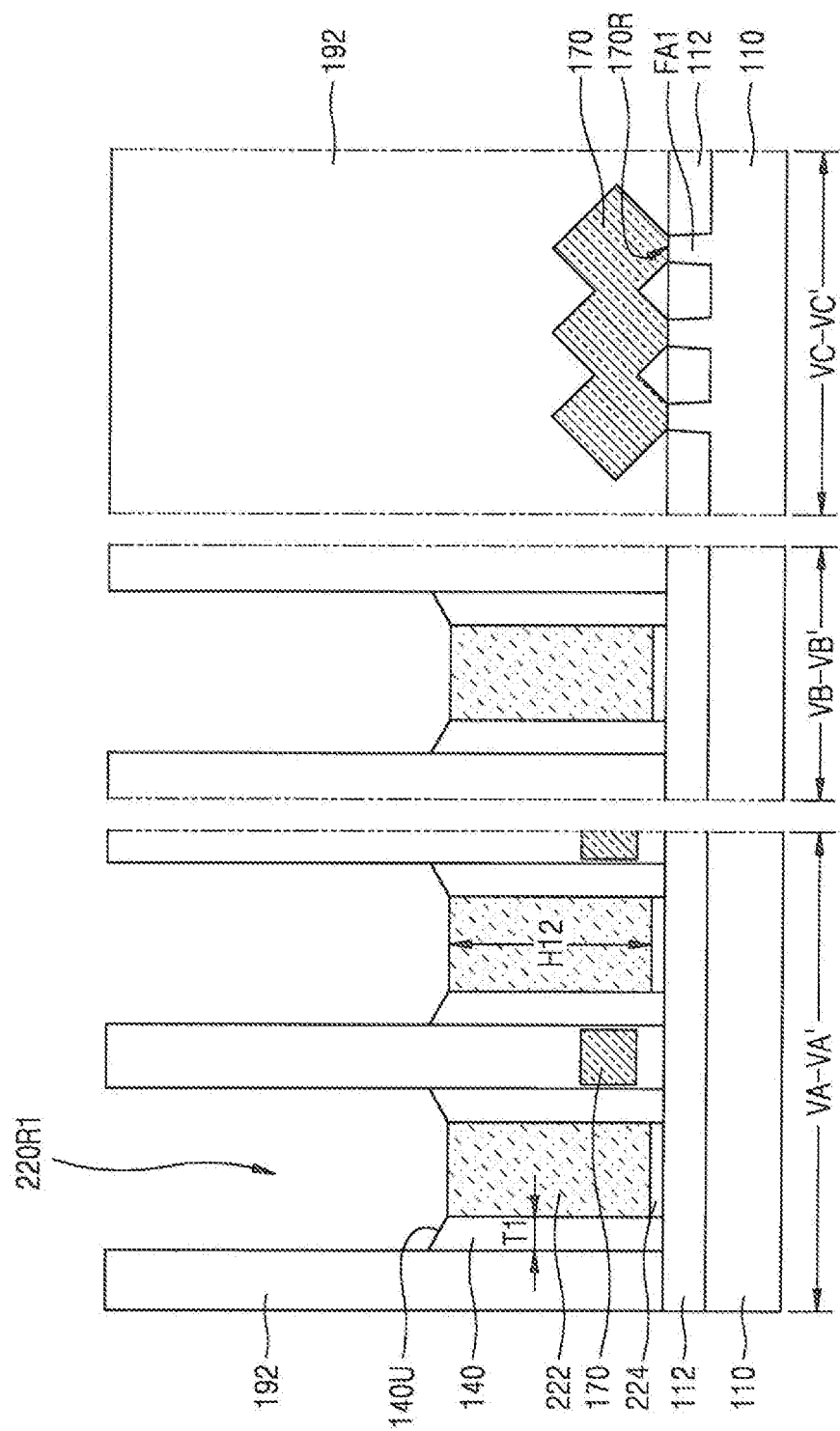

Referring to FIG. 9, the first etch stop layer 214 may be removed.

Thereafter, the lower capping layer 212, an upper portion of the first sacrificial gate 222, and an upper portion of the gate spacer structure 140 may be removed by a recess process to form a first recess region 220R1.

A remaining portion of the first sacrificial gate 222 may have a second height H12. The second height H12 may be equal to or less than about 50% of the first height H11 of the first sacrificial gate 222 before performing the recess process. For example, the second height H12 may range from about 20 to 150 nm. However, the present inventive concepts are not limited thereto. The gate spacer structure 140 may have a sloped upper surface 140U as a result of the recess process.

In some embodiments, a wide sacrificial gate having a larger width than the first sacrificial gate 222 may be further formed on the substrate 110. For example, the wide sacrificial gate may have a width greater than a width of the first sacrificial gate 222 in the first direction (e.g., the X direction). A contact area between the fin active region FA1 and the wide sacrificial gate may be greater than a contact area between the fin active region FA1 and the first sacrificial gate 222. The wide sacrificial gate may be used as a sacrificial gate for forming a high voltage transistor.

In some embodiments, in the recess process in which the upper portion of the first sacrificial gate 222 is removed to form the first recess region 220R1, an upper portion of the wide sacrificial gate may also be removed to form a wide recess region. For example, the sacrificial gates having different width may be removed in the same process without having to form a separate mask.

Referring to FIG. 10, after conformally forming an insulating layer on the inter-gate insulating layer 192 and in the first recess region 220R1, the insulating layer may be anisotropically etched to form an insulating liner 160 on an inner sidewall of the first recess region 220R1.

In some embodiments, the insulating liner 160 may be made of silicon nitride by an ALD process or a CVD process. The insulating liner 160 may be formed to have a second thickness T2 ranging from about 0.5 to 20 nm. Referring to FIG. 10, since the gate spacer structure 140 may have the sloped upper surface 140U, the insulating liner 160 may extend downwardly along the sloped upper surface 140U of the gate spacer structure 140.

As shown in FIG. 10, the second thickness T2 of the insulating liner 160 may be smaller than the first thickness T1 of the gate spacer structure 140, and an upper width of the first recess region 220R1 may be greater than a lower width thereof. Thus, an aspect ratio (i.e., a ratio of a height to the upper width) of the first recess region 220R1 may be reduced.

Referring to FIG. 11, a sacrificial gate conductive layer may be formed on the inter-gate insulating layer 192 and in the first recess region 220R1 and then may be planarized to expose an upper surface of the inter-gate insulating layer 192, such that a second sacrificial gate 226 may be formed to fill the first recess region 220R1. The second sacrificial gate 226 may include polysilicon.

A structure in which the first sacrificial gate 222 and the second sacrificial gate 226 are sequentially stacked on the sacrificial gate insulating pattern 224 may be referred to herein as a sacrificial gate stack 220. Since the second sacrificial gate 226 may be formed to fill the first recess region 220R1 having an enlarged inlet, a second width W12 of the second sacrificial gate 226 may be greater than a first width W11 of the first sacrificial gate 222 in the first direction. Thus, the sacrificial gate stack 220 may be formed to have a T-shape in which an upper width thereof is greater than a lower width thereof.

In some embodiments, the second sacrificial gate 226 may have a third height H31. For example, the third height H31 may range from about 30 to 200 nm.

A sum of the height H21 of the sacrificial gate insulating pattern 224, the height H12 of the first sacrificial gate 222, the height H31 of the second sacrificial gate 226 may be a height $H_{S2}$ of the sacrificial gate stack 220. Since an upper portion of the inter-gate insulating layer 192 is consumed by a predetermined thickness in the previously performed recess process, etc., the height $H_{S2}$ of the sacrificial gate stack 220 may further be reduced than the initial height $H_{S1}$ of the initial sacrificial gate stack (refer to FIG. 8).

Figure 12:
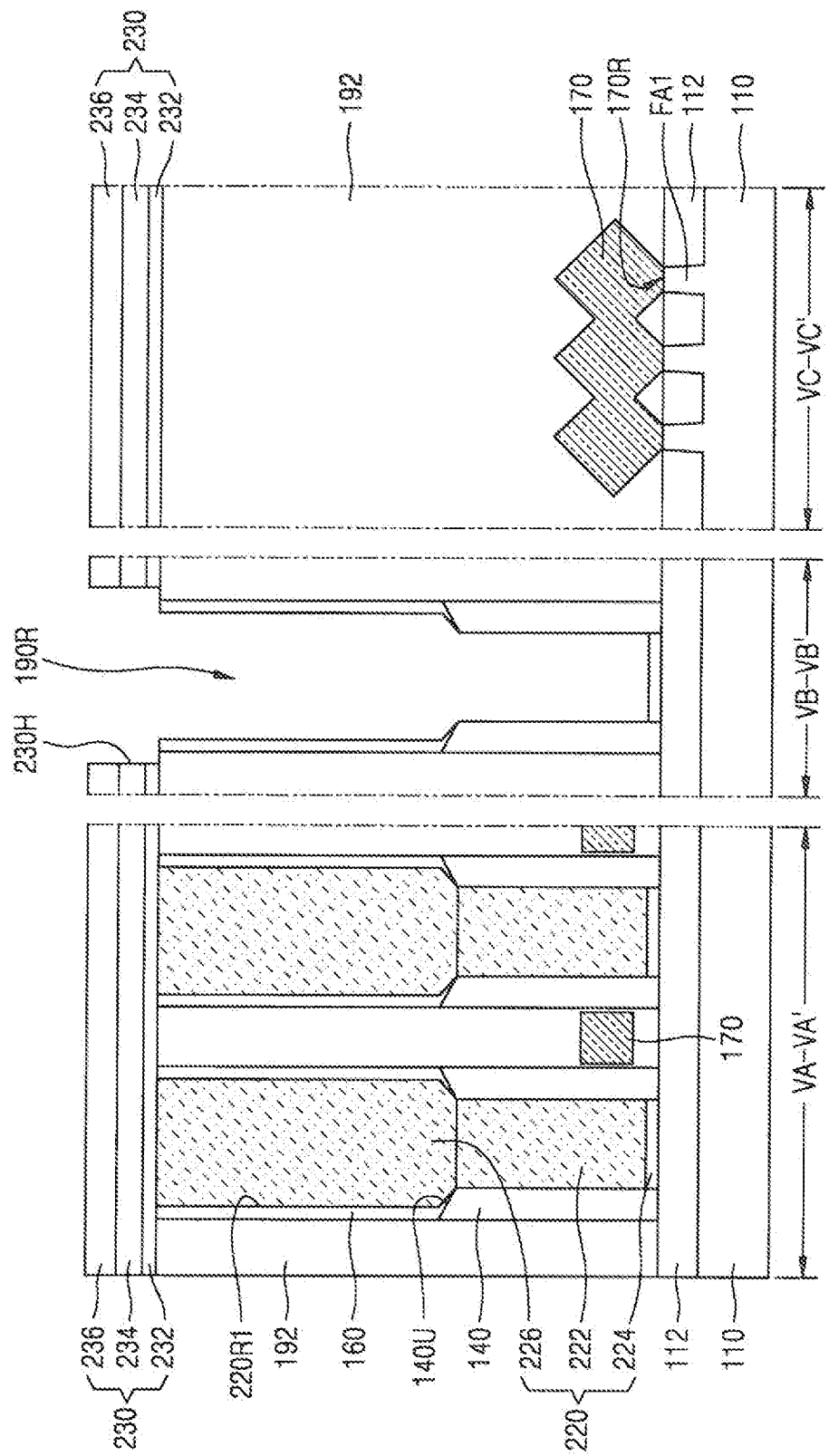

Referring to FIG. 12, a second hard mask pattern 230 including a first opening 230H may be formed on the inter-gate insulating layer 192 and the sacrificial gate stack 220. The first opening 230H may expose an upper surface of the sacrificial gate stack 220 in a line cut region CT (refer to FIG. 4).

In some embodiments, the second hard mask pattern 230 may include a lower material layer 232, a second etch stop layer 234 and an upper material layer 236 that are sequentially stacked on the inter-gate insulating layer 192 and the sacrificial gate stack 220. For example, the lower material layer 232 and the upper material layer 236 may be made of silicon oxide, and the second etch stop layer 234 may be made of silicon nitride.

Thereafter, the second sacrificial gate 226 and the first sacrificial gate 222 in the line cut region CT may be removed using the second hard mask pattern 230 as an etch mask to form a line cut recess region 190R. In some embodiments, the sacrificial gate insulating pattern 224 may be exposed on a lower surface of the line cut recess region 190R. However, the present inventive concepts are not limited thereto. For example, the sacrificial gate insulating pattern 224 may be removed together in the process of removing the second sacrificial gate 226 and the first sacrificial gate 222.

In some embodiments, the gate spacer structure 140 and the insulating liner 160 may remain on inner sidewalls of the line cut recess region 190R without being removed.

Figure 13:
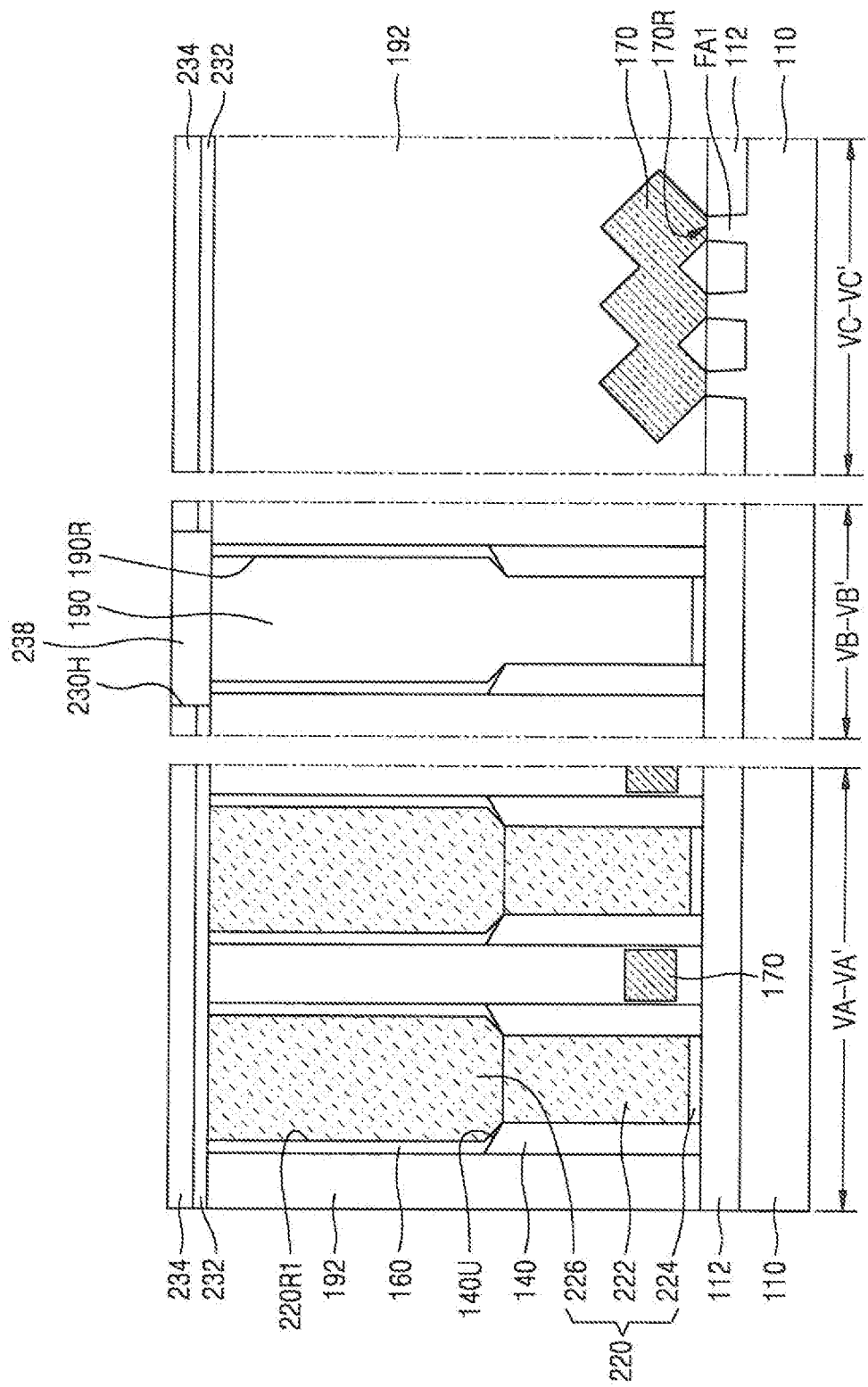

Referring to FIG. 13, after forming an insulating layer in the line cut recess region 190R and in the first opening 230H of the second hard mask pattern 230, an upper portion of the insulating layer may be removed by an etch back process to form a line gap-fill insulating layer 190 within and/or filling the line cut recess region 190R.

Thereafter, after forming an insulating layer on the second hard mask pattern 230 and the line gap-fill insulating layer 190, the insulating layer may be planarized until exposing an upper surface of the second etch stop layer 234 to form a line cut capping layer 238.

Figure 14:
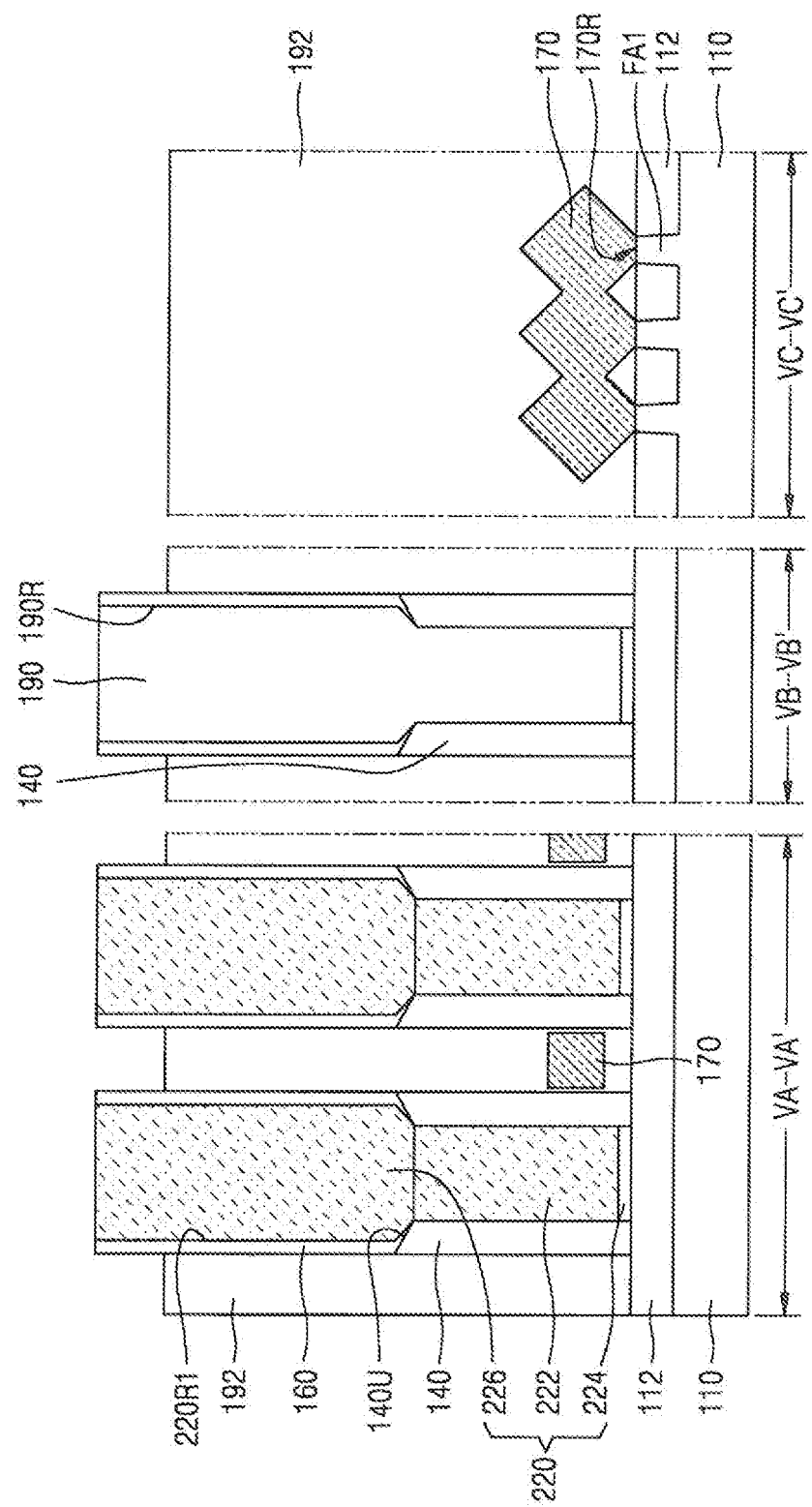

Referring to FIG. 14, the second etch stop layer 234, the lower material layer 232 and the line cut capping layer 238 may be removed to expose the upper surface of the inter-gate insulating layer 192, the upper surface of the sacrificial gate stack 220, and an upper surface of the line gap-fill insulating layer 190.

Thereafter, a recess process for removing an upper portion of the exposed inter-gate insulating layer 192 by a predetermined thickness may be performed. As shown in FIG. 14, while removing the upper portion of the inter-gate insulating layer 192, the sacrificial gate stack 220, the insulating liner 160, and the line gap-fill insulating layer 190 may not be removed.

Figure 15:
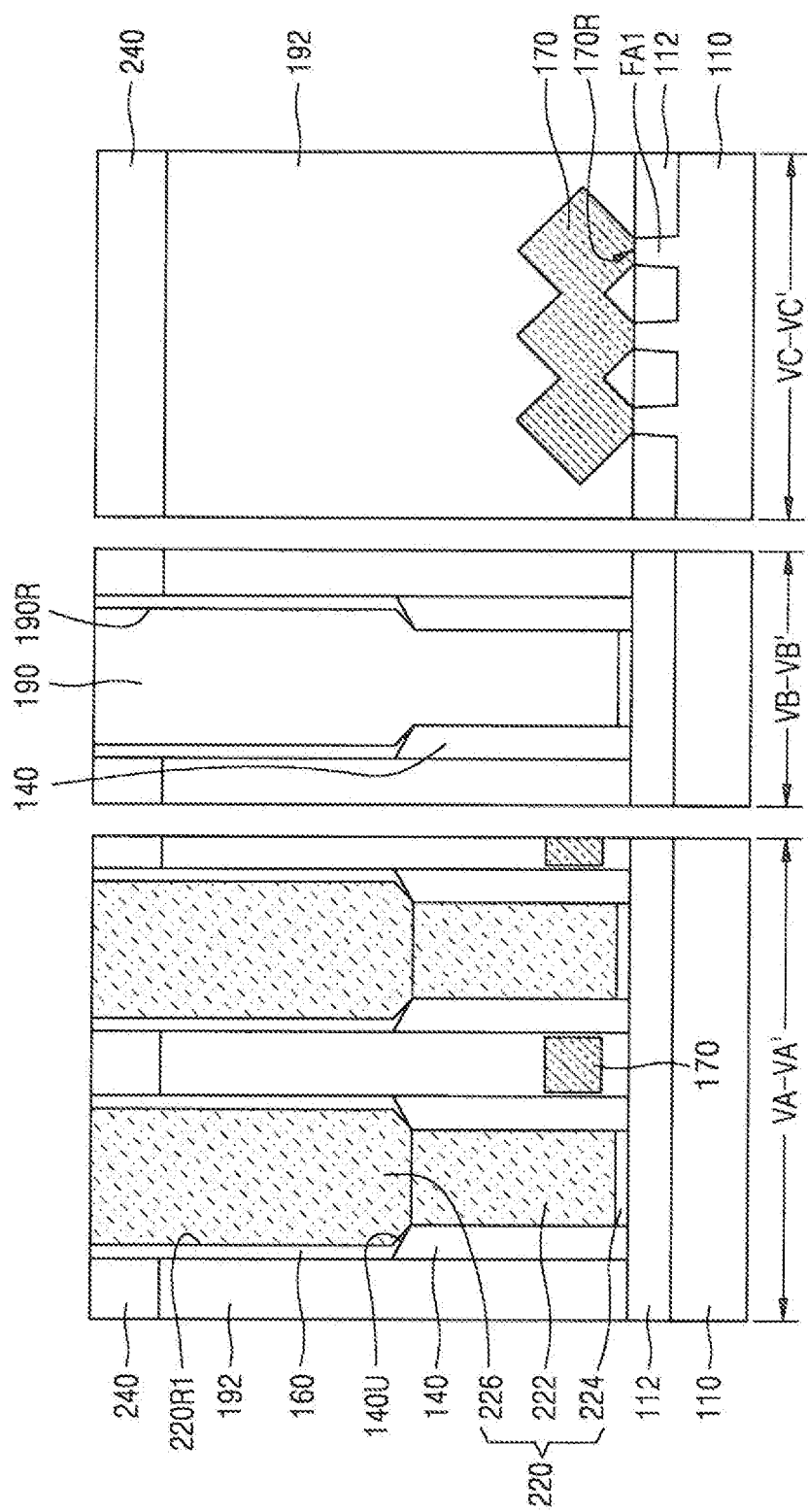

Referring to FIG. 15, an insulating layer may be formed on the inter-gate insulating layer 192, the sacrificial gate stack 220, the insulating liner 160 and the line gap-fill insulating layer 190, and then the insulating layer may be planarized until exposing the upper surface of the sacrificial gate stack 220 to form a capping layer 240 on the inter-gate insulating layer 192.

In some embodiments, the capping layer 240 may be made of silicon nitride. The capping layer 240 may act as a passivation layer to protect the inter-gate insulating layer 192 below the capping layer 240 in a subsequent wet etching process of removing the sacrificial gate stack 220.

Figure 16:
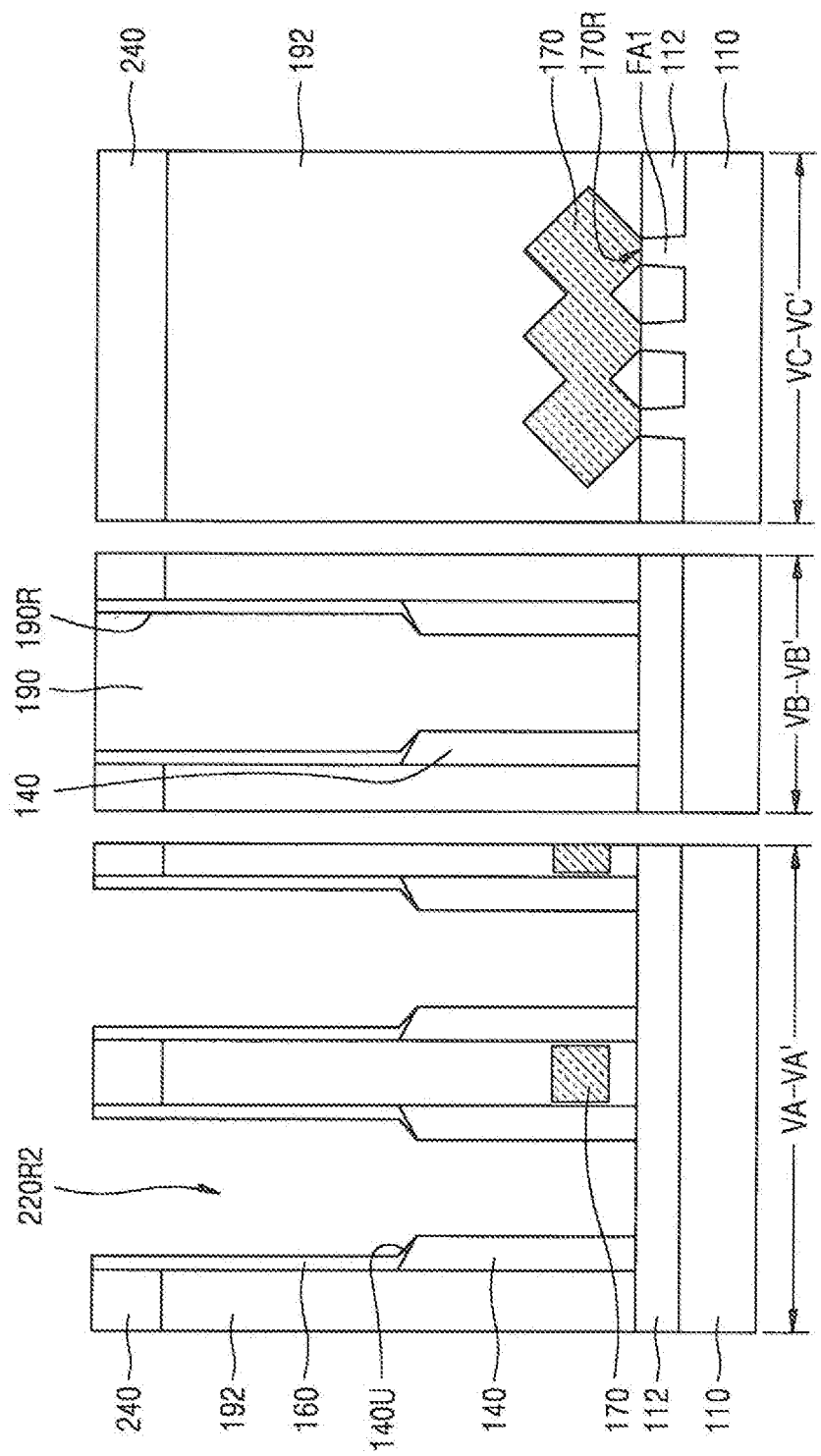

Referring to FIG. 16, the sacrificial gate stack 220 may be removed to form a second recess region 220R2.

In some embodiments, the process of removing the sacrificial gate stack 220 may be performed by a wet etching process. The wet etching process may be performed using an etchant including, for example, HNO3, diluted fluoric acid (DHF), NH₄OH, tetramethyl ammonium hydroxide (TMAH), KOH, or a combination thereof.

As shown in FIG. 16, since an upper width of the second recess region 220R2 is greater than a lower width thereof, a process failure in the process of removing the sacrificial gate stack 220 may be reduced and/or prevented. If an aspect ratio of the second recess region 220R2 were greater, a problem in which the sacrificial gate stack 220 is not completely removed due to an insufficient supply of the etchant may be generated. However, according to the example embodiments of the present inventive concepts, since the second recess region 220R2 has the enlarged upper width, the aspect ratio of the second recess region 220R2 may be reduced, such that the sacrificial gate stack 220 may be mostly and/or completely removed.

Figure 17:
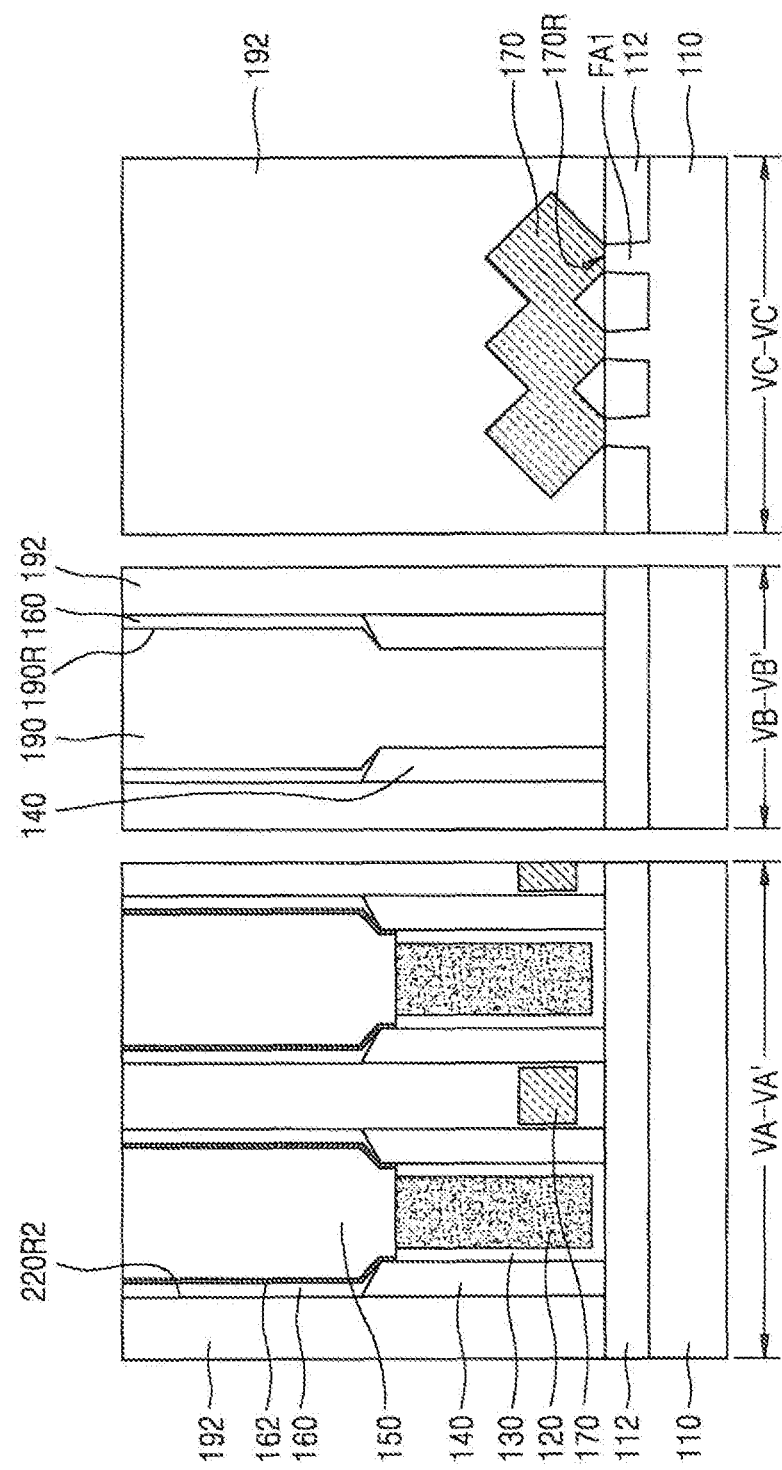

Referring to FIG. 17, a gate insulating layer 130 may be conformally formed in an inner surface of the second recess region 220R2. A conductive layer may be formed on the gate insulating layer 130 to fill the second recess region 220R2, and then an upper portion of the conductive layer may be etched back to form a gate electrode 120. When the upper portion of the conductive layer is etched back, a portion of the gate insulating layer 130 may be removed together such that an upper surface of the gate insulating layer 130 may be substantially coplanar with an upper surface of the gate electrode 120 as shown in FIG. 17.

As described previously, the enlarged upper width of the second recess region 220R2 may result in reduction of the aspect ratio of the second recess region 220R2, and thus a phenomenon in which the gate electrode 120 does not sufficiently fill the second recess region 220R2 may be reduced and/or prevented.

Thereafter, after forming an insulating layer on the inter-gate insulating layer 192 and the gate electrode 120 to fill a remaining portion of the second recess region 220R2, an upper portion of the insulating layer and the capping layer 240 may be removed until exposing the upper surface of the inter-gate insulating layer 192 such that an insulating capping layer 150 may be formed to be within and/or fill the remaining portion of second recess region 220R2.

A native oxide layer 162 may be formed on an interface between the insulating capping layer 150 and the insulating liner 160. In some embodiments, the native oxide layer 162 may be formed from a portion of the insulating liner 160, a portion of the gate spacer structure 140, and/or a portion of the second sacrificial gate 226. For example, the native oxide layer 162 may be formed to a predetermined thickness on surfaces of the insulating liner 160 and the gate spacer structure 140 exposed in the process of removing the sacrificial gate stack 220 (refer to, e.g., FIG. 15) and/or in the process of forming the gate electrode 120.

Figure 18:
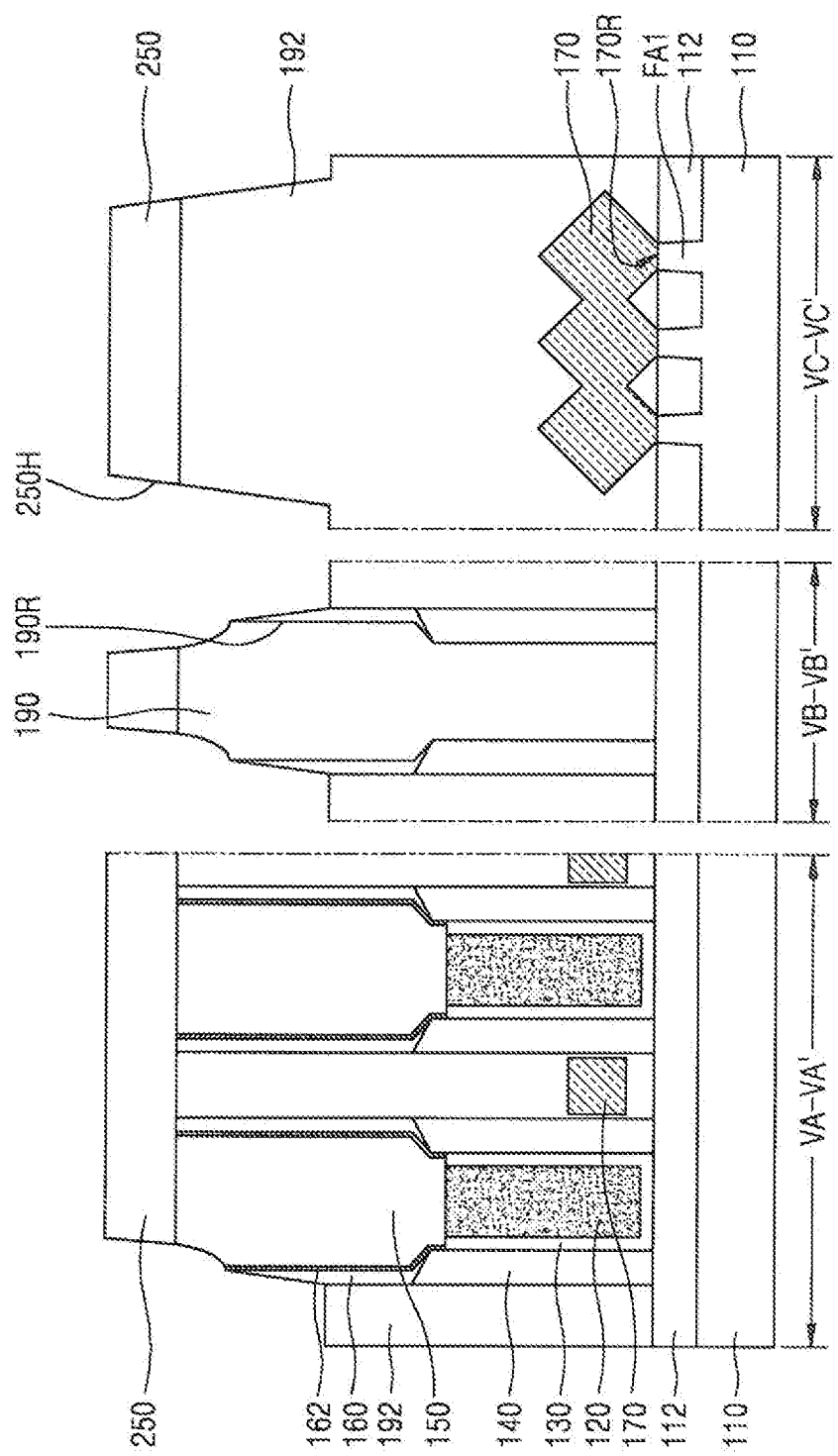

Referring to FIG. 18, a buried insulating layer 250 may be formed on the inter-gate insulating layer 192. After forming a mask pattern on the buried insulating layer 250, a portion of the buried insulating layer 250 and a portion of the inter-gate insulating layer 192 may be etched to form a second opening 250H. In this case, a portion of the insulating capping layer 150, a portion of the insulating liner 160, a portion of the native oxide layer 162, and a portion of the line gap-fill insulating layer 190 may be etched. The buried insulating layer 250 may include a TEOS layer and/or an ultra low-k (ULK) dielectric layer having a lower dielectric constant of about 2.2 to 2.4. The ULK dielectric layer may include a SiOC layer and/or a SiCOH layer.

Figure 19:
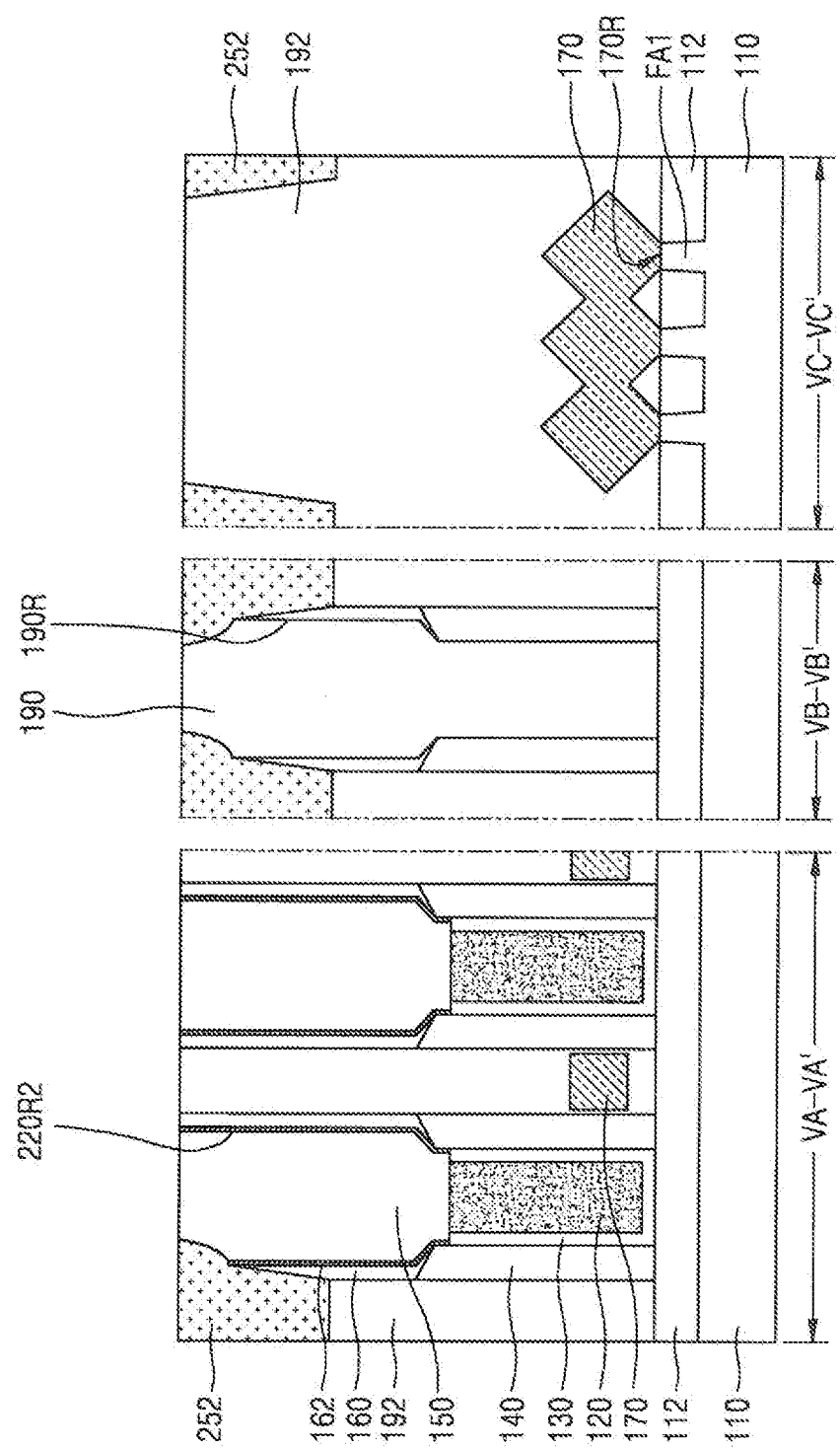

Referring to FIG. 19, after forming an insulating layer on the buried insulating layer 250 to fill the second opening 250H, the insulating layer may be planarized until an upper surface of the insulating capping layer 150 is exposed to form a capping pattern 252 filling the second opening 2501H. The capping pattern 252 may act as an etch mask for forming a self-aligned contact.

Figure 20:
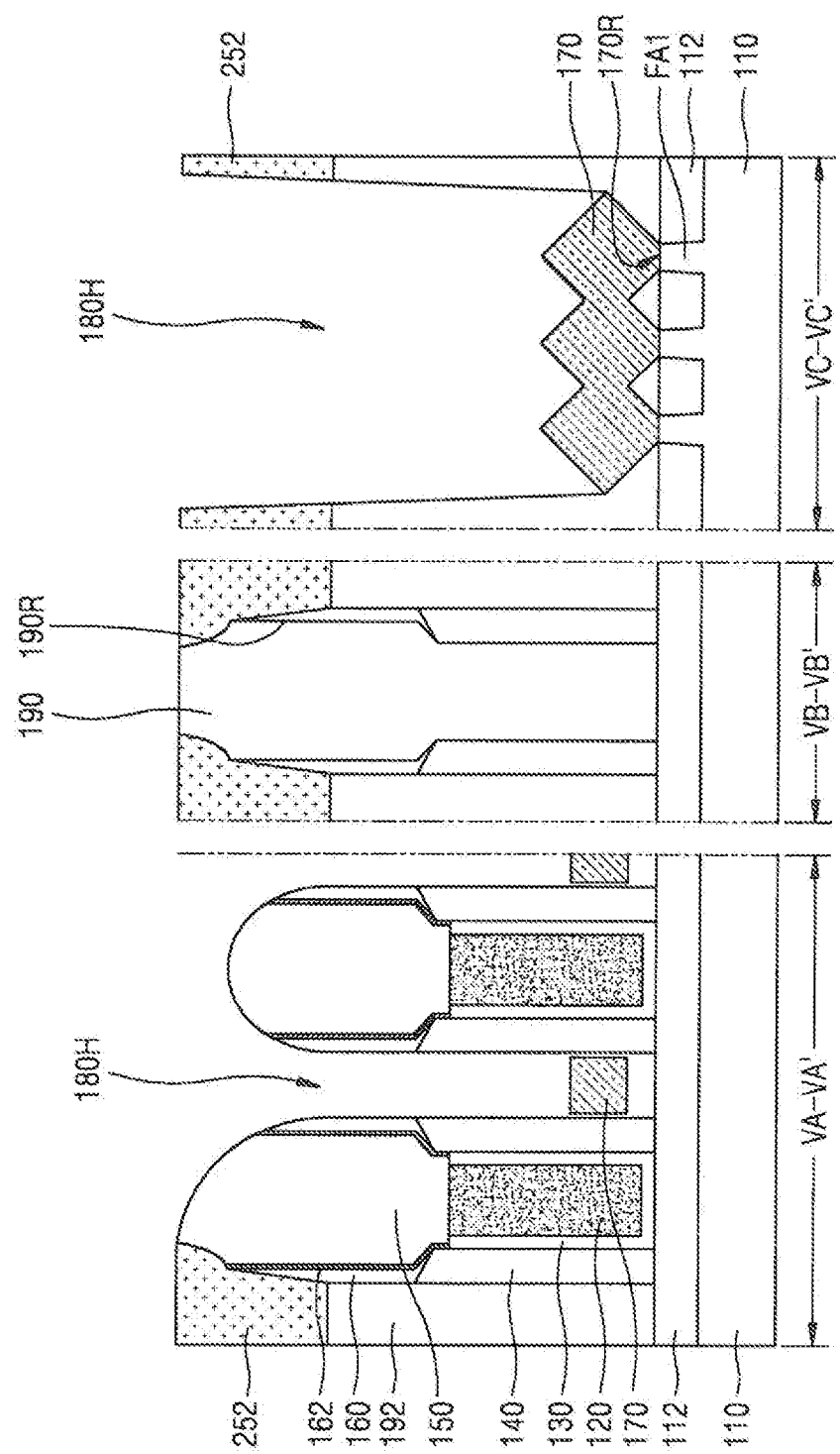

Referring to FIG. 20, the inter-gate insulating layer 192 may be etched using the capping pattern 252, the insulating capping layer 150, and the gate spacer structure 140 as an etch mask to form a contact hole 180H exposing the source/drain region 170.

In some embodiments, an upper surface of the insulating capping layer 150 may be consumed by a predetermined thickness such that the height of the insulating capping layer 150 may be lowered. The insulating capping layer 150 between two adjacent contact holes 180H may be formed to have a rounded upper surface or a gently sloped upper surface.

In some embodiments, when forming the contact hole 180H, the upper surface of the gate spacer structure 140 may not be exposed by the contact hole 180H. As described previously, since the height of the gate spacer structure 140 in the recess process of the first sacrificial gate 222 is reduced and the insulating liner 160 is formed on the sidewall of the first recess region 220R1, an upper portion of the insulating liner 160 and/or an upper portion of the insulating capping layer 150 may be removed in the process of forming the contact hole 180H. In conventional processes in which the second spacer layer 144 (refer to e.g., FIG. 3) including the insulating material having a lower dielectric constant is exposed in the aforementioned etching process, the second spacer layer 144 may be damaged or removed. However, according to the example embodiments of the present inventive concepts, damage to the gate spacer structure 140 may be reduced and/or prevented.

In other embodiments, to prevent damage to the gate spacer structure 140 in the process of forming the contact hole 180H, the gate spacer structure 140 may also be removed in the etch back process for forming the gate electrode 120. In this case, the upper surface of the gate electrode 120 may be substantially coplanar with the upper surface of the gate spacer structure 140 unlike that shown in FIG. 20.

Referring to FIGS. 5 and 20, a contact 180 may be formed to fill the contact hole 180H. In some embodiments, the contact 180 may be formed in a structure of multiple layers. The contact 180 may be made of, for example, tungsten (W), cobalt (Co), and/or a silicide thereof. In some embodiments, before forming the contact 180, a barrier layer may be selectively formed on inner surface of the contact hole 180H using, for example, Ti, Ti, Ta, TiN, TaN, and/or a combination thereof.

Thereafter, the contact 180 and the capping pattern 252 may be planarized until exposing the upper surface of the inter-gate insulating layer 192. In other embodiments, the capping pattern 252 may remain on the inter-gate insulating layer 192 without being completely removed.

The semiconductor device 100A shown in FIGS. 4 and 5 according to the example embodiments may be fabricated by the aforementioned processes.

In a conventional process in which a single sacrificial gate including polysilicon is used, a thickness of the sacrificial gate can be reduced through the subsequent processes, and thus an initial thickness of the single sacrificial gate may be formed to be sufficiently large. Furthermore, the initial thickness of the single sacrificial gate may be formed to be larger to ensure a process margin in a subsequent process of forming a self-aligned contact. Thus, in a single sacrificial gate removing process, an aspect ratio of an opening may significantly increase. As a result, a loading effect in which an etchant or a source material is not smoothly supplied through the opening may be generated. The greater the initial thickness of the single sacrificial gate, the more difficult it may be to adjust precisely the fabrication process.

However, according to example embodiments of the inventive concepts, by the process of forming the sacrificial gate stack 220 including the first sacrificial gate 222 and the second sacrificial gate 226, the initial thickness $H_{S1}$ of the initial sacrificial gate stack as well as the thickness $H_{S2}$ of the sacrificial gate stack 220 may be significantly reduced compared to the single sacrificial gate of a conventional process. Accordingly, in the removal process of the sacrificial gate stack 220 according to embodiments of the present inventive concepts, the aspect ratio of the opening may be significantly reduced, and thus the loading effect may be reduced and/or prevented.

According to an embodiment, as the upper width of the opening is enlarged by the recess process of removing the upper portion of the first sacrificial gate 222, the process precision in the process for forming the sacrificial gate stack 220 and/or in the process for forming the gate electrode 120 may be improved.

In the method of manufacturing the semiconductor device 100A with respect to FIGS. 6 to 20, the sacrificial gate stack 220 of the T-shape including the first sacrificial gate 222 and the second sacrificial gate 226 may be formed. In some embodiments, a recess process of removing an upper portion of the second sacrificial gate 226 and a process of forming a third sacrificial gate in the removed region of the second sacrificial gate 226 may further be selectively performed. Thus, the sacrificial gate stack 220 may be formed in a multi-layered structure including the first sacrificial gate 222, the second sacrificial gate 226 and the third sacrificial gate.

In some embodiments, the first hard mask pattern 210 may include a laminated structure of a lower material layer and an upper material layer that have different etch selectivity, instead of including the lower capping layer 212, the first etch stop layer 214, and the upper capping layer 216 as shown in FIG. 6. For example, the lower material layer may include silicon nitride, and the upper material layer may include silicon oxide. A planarization process may be performed until exposing an upper surface of the lower material layer. Thereafter, the process described in FIG. 9 may be performed.

In other embodiments, the process of forming the line cut recess region 190R and the process of forming the line gap-fill insulating layer 190 described in FIGS. 12 and 13 may be performed after the process of forming the gate electrode 120 described in FIG. 17, instead of being performed after the process of forming the sacrificial gate stack 220.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor device comprising:
   a fin active region protruding from a substrate, the fin active region extending in a first direction parallel to an upper surface of the substrate;
   a gate electrode on an upper surface and sidewalls of the fin active region, the gate electrode extending in a second direction across the fin active region;
   a gate spacer structure on a sidewall of the gate electrode, an upper surface of the gate spacer structure positioned at a higher level than an upper surface of the gate electrode relative to the upper surface of the substrate;
   an insulating capping layer on the gate electrode, a first portion of the insulating capping layer having a first width greater than a second width of the gate electrode in the first direction;

an insulating liner on a sidewall of the insulating capping layer and on the upper surface of the gate spacer structure, the insulating liner having a second thickness less than a first thickness of the gate spacer structure in the first direction;

a source/drain region at a side of the gate electrode;

a self-aligned contact connected to the source/drain region, a sidewall of the self-aligned contact being in contact with the gate spacer structure and the insulating liner; and a native oxide layer between the insulating liner and the insulating capping layer.

2. The semiconductor device of claim 1, wherein the native oxide layer extends from between the insulating liner and the insulating capping layer to between the gate spacer structure and the insulating capping layer.

3. The semiconductor device of claim 1, wherein the second thickness of the insulating liner is greater than a third thickness of the native oxide layer, and wherein the insulating liner includes nitride.

4. The semiconductor device of claim 1, wherein the first portion of the insulating capping layer is positioned at a higher level than the upper surface of the gate spacer structure relative to the upper surface of the substrate, wherein a second portion of the insulating capping layer is positioned at a lower level than the upper surface of the gate spacer structure relative to the upper surface of the substrate, and wherein a third width of the second portion of the insulating capping layer is less than the first width of the first portion of the insulating capping layer in the first direction.

5. The semiconductor device of claim 1, wherein the gate spacer structure includes a first spacer layer on the sidewall of the gate electrode, a second spacer layer on the first spacer layer and a third spacer layer on the second spacer layer, wherein the second spacer layer includes an insulating material having a lower dielectric constant than that of the first and second spacer layers, and wherein the self-aligned contact is not in contact with the second spacer layer.

6. The semiconductor device of claim 1, wherein a lower surface of the insulating liner contacts the upper surface of the gate spacer structure and is positioned at a higher level than the upper surface of the gate electrode relative to the upper surface of the substrate.

7. The semiconductor device of claim 1, wherein the substrate includes a line cut region that is spaced apart from the fin active region, and wherein the gate spacer structure and the insulating liner extend to the line cut region.

8. The semiconductor device of claim 7, further comprising a line gap-fill insulating layer on the substrate in the line cut region, wherein the gate spacer structure and the insulating liner are on a sidewall of the line gap-fill insulating layer.

9. The semiconductor device of claim 8, wherein an upper surface of the gate spacer structure on the sidewall of the line gap-fill insulating layer is positioned at substantially the same level as the upper surface of the gate spacer structure on the sidewall of the gate electrode relative to the upper surface of the substrate.

10. A semiconductor device comprising:

a fin active region protruding from a substrate, the fin active region extending in a first direction parallel to an upper surface of the substrate;

a gate electrode covering an upper surface and sidewalls of the fin active region, the gate electrode extending in a second direction crossing the first direction;

a gate spacer structure on opposite sidewalls of the gate electrode;

an insulating capping layer on the gate electrode, the insulating capping layer extending in the second direction;

an insulating liner on opposite sidewalls of the insulating capping layer and on an upper surface of the gate spacer structure, the insulating liner extending in the second direction and having a second thickness smaller than a first thickness of the gate spacer structure;

a native oxide layer between the insulating liner and the insulating capping layer; and a self-aligned contact at a side of the gate electrode, a sidewall of the self-aligned contact being in contact with the gate spacer structure and the insulating liner.

11. The semiconductor device of claim 10, wherein the upper surface of the gate spacer structure is positioned at a higher level than an upper surface of the gate electrode relative to the upper surface of the substrate.

12. The semiconductor device of claim 10, wherein the upper surface of the gate spacer structure is sloped toward the gate electrode.

13. The semiconductor device of claim 10, wherein a first width of an upper portion of the insulating capping layer is greater than a second width of a lower portion of the insulating capping layer, and wherein the insulating capping layer has a T-shape.

14. The semiconductor device of claim 10, wherein the sidewall of the self-aligned contact is in contact with the insulating capping layer.

15. A semiconductor device comprising:

a substrate;

a fin active region protruding from the substrate, the fin active region extending in a first direction;

a gate electrode on the fin active region, the gate electrode extending in a second direction that crosses the first direction;

a gate spacer structure on a sidewall of the gate electrode;

an insulating capping layer on the gate electrode, the insulating capping layer comprising a first upper portion having a first width and a second lower portion having a second width, smaller than the first width, between the first upper portion and the substrate; and an insulating liner on an upper surface of the gate spacer structure and on a sidewall of the insulating capping layer, the insulating liner comprising a second thickness in the first direction that is smaller than a first thickness of the gate spacer structure in the first direction, wherein the insulating liner does not extend between the gate electrode and the insulating capping layer that is on the gate electrode.

16. The semiconductor device of claim 15, wherein the gate spacer structure comprises a first spacer layer, a second spacer layer on the first spacer layer, and a third spacer layer on the second spacer layer, and wherein the second spacer layer comprises a material having a dielectric constant lower than that of the first spacer layer and the third spacer layer.

17. The semiconductor device of claim 16, further comprising a source/drain region adjacent the gate electrode, and a contact adjacent the gate electrode and coupled to the source/drain region, wherein an upper portion of the contact contacts the insulating capping layer, wherein a lower portion of the contact contacts the third spacer layer of the gate spacer structure, and wherein the contact does not contact the second spacer layer of the gate spacer structure.

18. The semiconductor device of claim 15, wherein a first distance between an upper surface of the first upper portion of the insulating capping layer and the substrate is greater than a second distance between the upper surface of the gate spacer structure and the substrate.

19. The semiconductor device of claim 15, wherein a portion of the insulating liner is between the upper surface of the gate spacer structure and the first upper portion of the insulating capping layer.

20. The semiconductor device of claim 15, further comprising a native oxide layer between the insulating liner and the insulating capping layer.

* * * * *